United States Patent [19]

Ware et al.

[11] Patent Number: 5,764,963

[45] Date of Patent: Jun. 9, 1998

[54] METHOD AND APPARATUS FOR PERFORMING MASKABLE MULTIPLE COLOR BLOCK WRITES

[75] Inventors: Frederick Abbott Ware, Los Altos; Richard Maurice Barth, Palo Alto; Craig Hampel, San Jose; John Bradly Dillon, Palo Alto; Billy W. Garrett, Mountain View, all of Calif.

[73] Assignee: Rambus, Inc., Mountain View, Calif.

[21] Appl. No.: 531,583

[22] Filed: Sep. 20, 1995

Related U.S. Application Data

[63] Continuation of Ser. No. 499,204, Jul. 7, 1995, abandoned.
[51] Int. Cl.⁶ .................................................. G06F 13/00
[52] U.S. Cl. .......................... 395/507; 395/481; 395/800; 395/523; 364/252.5
[58] Field of Search ........................... 395/800, 481, 395/523, 507; 364/252.5

[56] References Cited

U.S. PATENT DOCUMENTS

| | | | |
|---|---|---|---|
| 4,713,684 | 12/1987 | Kawamura et al. | 358/78 |
| 4,821,208 | 4/1989 | Ryan et al. | 364/518 |
| 5,134,667 | 7/1992 | Suzuki | 382/22 |
| 5,159,320 | 10/1992 | Matsuo et al. | 340/701 |
| 5,329,385 | 7/1994 | Washio | 358/515 |
| 5,420,608 | 5/1995 | Choi et al. | 345/186 |
| 5,430,464 | 7/1995 | Lumelsky | 345/191 |
| 5,504,855 | 4/1996 | Priem et al. | 395/162 |
| 5,528,751 | 6/1996 | Priem et al. | 395/164 |
| 5,533,187 | 7/1996 | Priem et al. | 395/164 |
| 5,539,430 | 7/1996 | Priem et al. | 345/185 |
| 5,659,518 | 8/1997 | McLaury | 365/230.05 |

*Primary Examiner*—Jack B. Harvey
*Assistant Examiner*—Valerie Darbe
*Attorney, Agent, or Firm*—Blakely, Sokoloff, Taylor & Zafman, LLP

[57] ABSTRACT

Circuitry for performing a memory block write is described. The memory block includes b block words, each block word having t block bytes. Each block byte has s bits of memory. Each block byte is associated with at least two associated mask value bits. A constant register has at least s×t bits of memory arranged as t constant bytes, each constant byte storing a constant value, each constant byte associated with one block of every block word. The block write circuitry includes control circuitry for selecting one of a normal write function and a block write function in accordance with a block write signal. When the block write function is selected, the control circuitry stores the associated constant value in every nonmasked block byte substantially simultaneously in accordance with a value of the associated mask value bits.

13 Claims, 28 Drawing Sheets

METHOD AND APPARATUS FOR PERFORMING MASKABLE MULTIPLE COLOR BLOCK WRITES

This is a continuation of application Ser. No. 08/499,204, filed Jul. 7, 1995, now abandoned.

FIELD OF THE INVENTION

The present invention pertains to the field of memories. More particularly, this invention relates to circuitry and a method for performing a block write of a constant value to a memory.

BACKGROUND OF THE INVENTION

"Block write" refers to the ability of a memory component to write a constant value into a block of sequential memory locations at a rate much higher than what is possible with a conventional write transaction. A block write ability is particularly useful in graphic or video systems where sections of a display must be "painted" with a predetermined set of colors.

Typically, blocks of sequential memory addresses are linked or mapped to sections of the display. The smallest addressable point on a display is often referred to as a "pixel." One or more memory locations may be associated with a given pixel. The appearance of the pixel changes in accordance with the values stored in the associated memory locations. A block of memory might be associated with a number of pixels.

In order to paint a given section of the display with a predetermined color, a constant representing the predetermined color might be written to the memory locations within a block corresponding to the given section of the display. Thus all of the pixels associated with that memory block will take on the predetermined color. A block write permits a write to all the memory addresses within the memory block substantially simultaneously so that the painting function is completed in a shorter amount of time.

Although a constant representing a color is what is actually stored, the words "constant" and "color" will be used interchangeably. In other words "storing a constant" is equivalent to "storing a color."

FIG. 1 shows some of the common features of modern solid-state memory components. The memory components typically contain a two dimensional array of storage cells. These storage cells may be static (e.g., a bistable latch) or dynamic (e.g., a single capacitor holding a charge). The arrays may be grouped into separate banks which are capable of independent operation. A row of storage cells is read when a row address is applied to the row decoder and the appropriate read control signals are asserted. This entire row is held in a row of column amplifiers (sense amplifiers) which are typically static in nature. Any subset of this sensed row may be accessed internally using column addresses and control signals.

A conventional write operation requires additional control. The conventional write operation is typically a two step process. The information to be written is placed on the write data signal lines. The write enable signal is asserted for only those bits of a row which have been selected by the column select circuitry and which are to be modified. Write enable signals are not asserted for the remaining bits. The read/write column signal is then asserted, permitting those sense amplifiers of the row with the write enable signal asserted to be modified with the write data received across the write data signal lines. Subsequently, using the write row signals, the entire row may be rewritten from the column amplifiers back to the memory array, with the subset of the storage cells modified according to the modified bits in the sense amplifiers.

One disadvantage of the prior art memory is that the two step write process typically must be repeated for each row that is to be programmed even if the same value (i.e., a constant) is to be written to every memory location within a selected block of memory.

One prior art block write memory design permits controlling the value to be written to each byte in the selected block of memory using one bit of a mask value. Because each bit can only have a value of "0" or "1," each bit of the mask value only controls whether or not a constant value is written to each byte in the block. Thus the mask value effectively "masks" the memory block so that the user selects which bytes within the block are updated with the constant value. The masked memory locations retain their previous values. The non-masked memory locations are updated with the constant value. This function is referred to as a one-color, maskable block write.

Another prior art block write memory design uses the selection information on the write data signal lines to determine which of two constants are written to each byte within the memory block. This function is referred to as a two-color, non-maskable block write because every byte within the memory block must be updated with one of the two constants. No byte within the block may retain its previous contents.

There is a granularity issue with the two-color, non-maskable block write operation. In other words, the two-color, non-maskable block write operation may not provide sufficient resolution if the region of memory to be written to either (1) takes up only a portion of a block; or (2) is not aligned to a block of memory. This operation must write either a foreground or background color into each byte throughout an entire block.

Thus, one disadvantage of the two-color, non-maskable block write operation is that if the region that is being filled or painted does not align to a block boundary, then the portions of the region that are not block-aligned may need to be handled as a special case. Another disadvantage of the two-color, non-maskable block write operation is that small regions may not be able to use the two-color block write at all.

The edges and small regions might be handled with two passes of the prior art one-color, maskable block write. However, the two passes would reduce the writing bandwidth (the amount of memory written to the block per write cycle) by a factor of two. The overhead associated with making two passes of the prior art one-color, maskable block write may make such an option impractical. Because small regions tend to account for much of the drawing operations in typical graphics applications and benchmarks, the two-color, non-maskable block write function might only be useful in limited situations.

SUMMARY OF THE INVENTION

Circuitry for performing a block write using two or more bits of a mask value to permit the maskable selection of more than one constant for each group of n bytes within a block of memory is described.

Variations of the memory block write circuitry that help to decrease wire area are also described. These variations include a sensing cell architecture using separate data and select signal lines, and block write circuitry using a reversed bit/byte pin/time sequence.

Another block write circuit uses the row address register to perform a block write from one memory block to another memory block.

Circuitry for performing a block write wherein a bit mask value controls the writing of a subset of the bits within a selected byte of memory is also described. For a selected byte, each bit of the bit mask value controls whether a bit in the selected byte is overwritten with a corresponding bit from a constant value.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Multiple-Color, Maskable Block Write

If one bit in the mask value controls each byte that is written into memory, then it is necessary to choose if that bit controls whether the color value is written or which of two color values is written. If two or more mask value bits control each byte written into memory, greater functionality, including masking and choosing from more than two colors, may be achieved.

To understand how the multiple-color, maskable block write functionality can be achieved at the device level, it is necessary to understand how the memory is organized into blocks from a simple 1×m-bit memory device, such as a DRAM.

Figure 1:
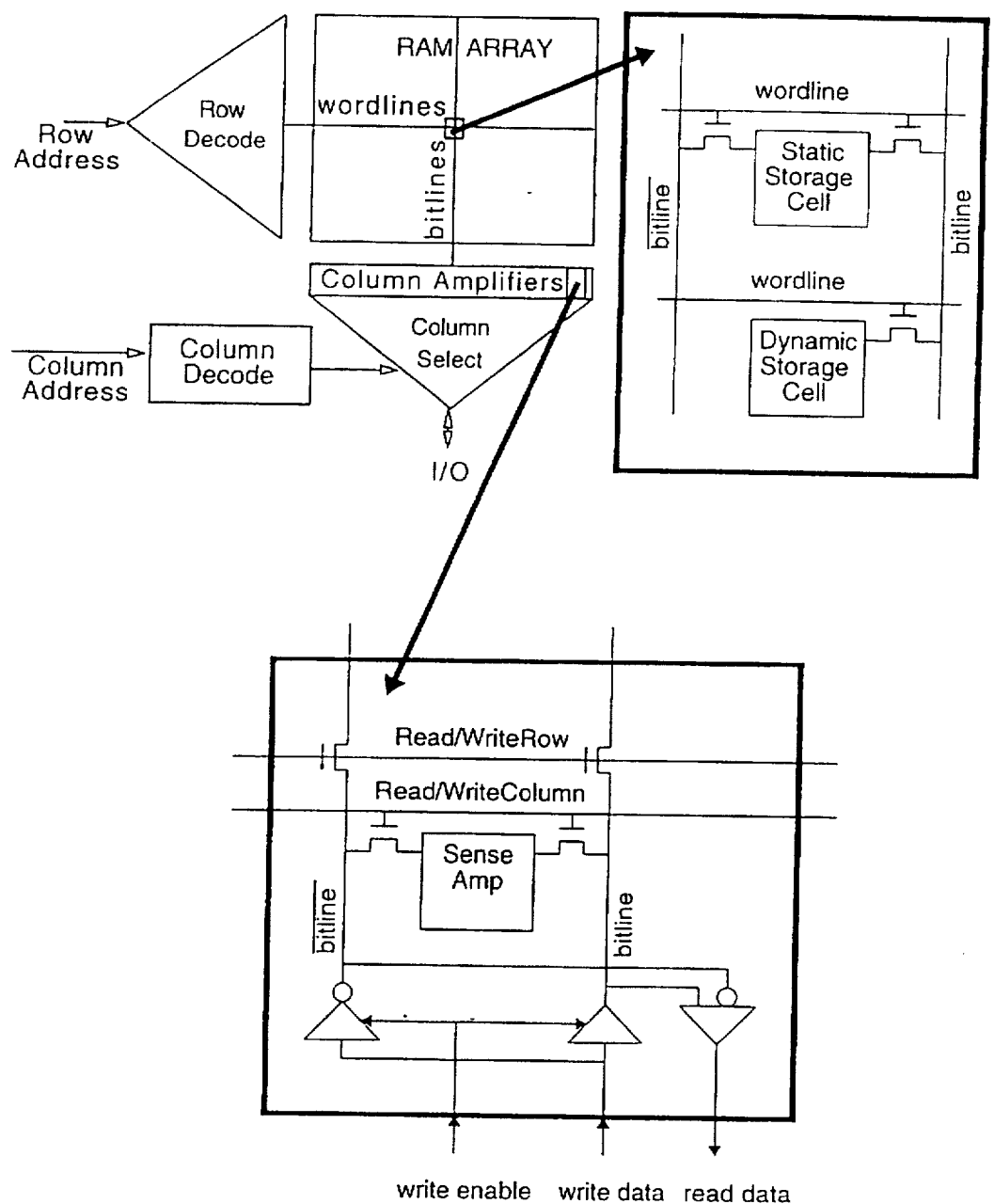
FIG. 1 illustrates a modern solid-state memory component.
Figure 2:
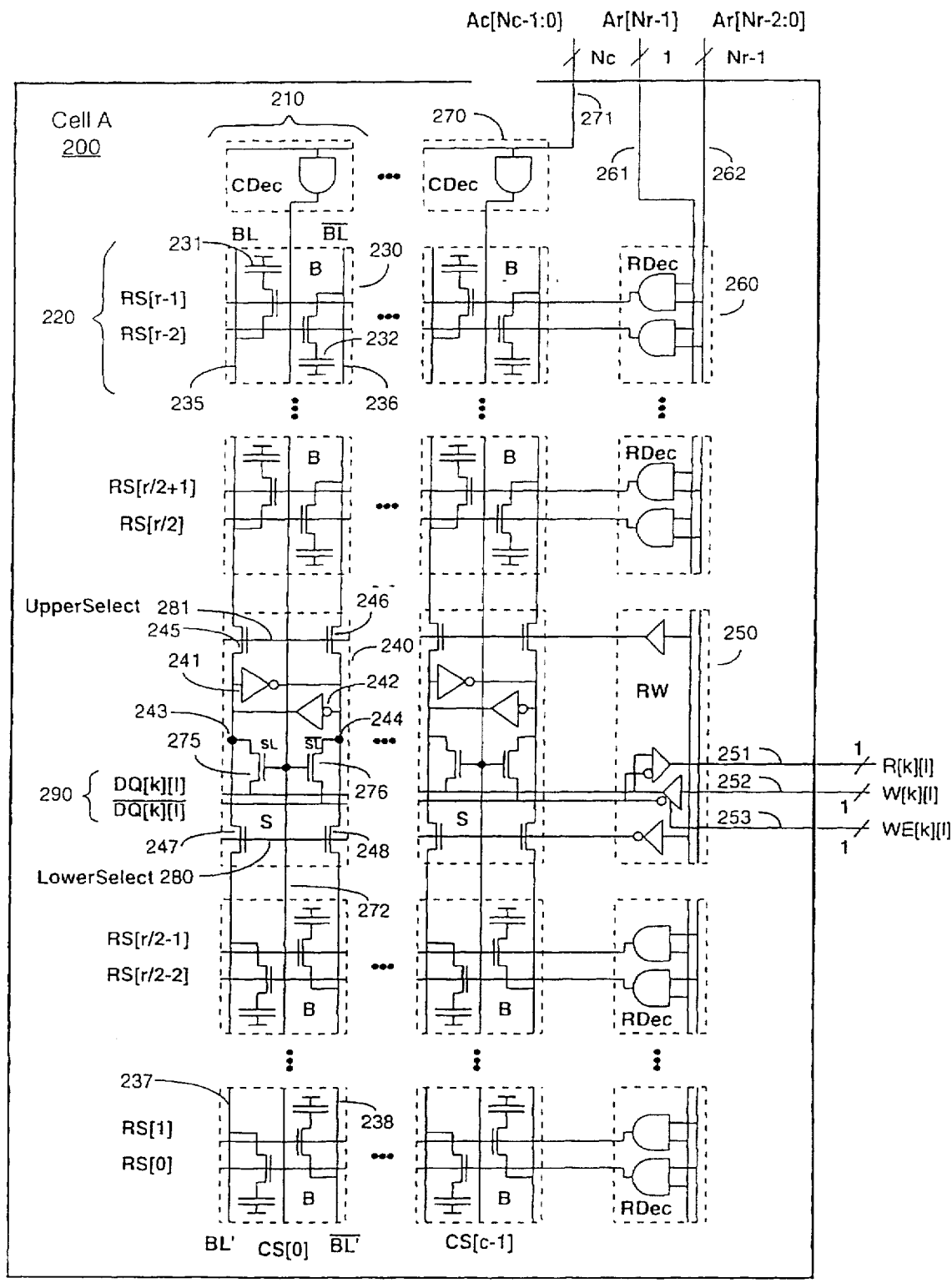
FIG. 2 illustrates a prior art DRAM memory array.

FIG. 2 illustrates some of the internal detail of an idealized prior art DRAM. FIG. 2 is intended to show how information flows in the DRAM, and not how a DRAM operates at a detailed circuit level. For example, the precharging circuitry is not shown. In an actual DRAM, the row and column decoding circuitry is typically shared between as many storage subarrays as possible. Table 1 illustrates the notation used in FIG. 2 and subsequent figures.

TABLE 1

| Term | Description |
|---|---|
| Nr | Number of row address signals |
| Ar[Nr-1:0] | Row address signals |
| r | Number of rows (r = $2^{Nr}$) |
| RS[r-1:0] | Row Select signals (also known as Word Lines - WL) |
| Nc | Number of column address signals |
| Ac[Nc-1:0] | Column address signals |
| c | Number of columns (c = $2^{Nc}$) |
| CS[c-1:0] | Column Select signals |
| BL, $\overline{BL}$, BL', $\overline{BL'}$ | Bit Line nodes (one set per column) |
| SL, $\overline{SL}$ | Sense Line nodes (one set per column) |
| DQ[k][l], $\overline{DQ[k][l]}$ | Data signal and complement for column mux/demux |
| R[k][l] | Read data signal |
| W[k][l] | Write data signal |
| WE[k][l] | Write enable signal |
| | [byte][bit] index for cell A |

TABLE 1-continued

| Term | Description |
|---|---|
| s | Number of bits per byte (typically 8 or 9) |
| t | Number of bytes read or written in column operations by DRAM |
| b | Number of blocks (of t bytes) written in block column operations by DRAM |

Cell "A" (200) is built from an array of "r/2" rows (e.g., 220) and "c" columns of "B" cells. Each B cell 230 contains two storage nodes, 231 and 232. Each column 210 of B cells contains a BL line and a $\overline{BL}$ line. The sense cell "S" (240) is placed in the center of each column, so there are r/4 B cells above the S cell and r/4 B cells below it. The upper r/4 B cells connect to the upper BL and $\overline{BL}$ lines, and the lower r/4 cells connect to the lower BL and $\overline{BL}$ lines. The upper BL and $\overline{BL}$ lines will be referred to as the BL (235) and $\overline{BL}$ (236) lines. The lower BL and $\overline{BL}$ lines will be referred to as the BL' (237) and $\overline{BL'}$ (238) lines.

The BL and BL' lines are connected to the SL (243) nodes of the sense amps through upper (245) and lower (247) pass devices. The $\overline{BL}$ and $\overline{BL'}$ lines are connected to the $\overline{SL}$ (244) nodes of the sense amps through upper (246) and lower (248) pass devices. Upper and lower pass devices 245, 246, 247, and 248, are enabled by UpperSelect 281 and LowerSelect 280 signal lines. The SL nodes (243/244) are connected to the DQ[k][l] nodes (290) through pass devices 275 and 276 which are enabled by the CS line (272) of that column.

A read transaction requires two separate operations to occur. The bitlines (collectively referred to as "BL"), sense amplifiers (S cells), and sense lines (collectively referred to as "SL") are initially in a precharged state (the precharging circuitry is not shown) and the row select lines RS (word lines, e.g., 220) are held unasserted. Row address Ar[Nr-1:0] (261 thru 262) is received and decoded by the row decode ("RDec") cells (e.g., 260) so that one of the RS[r-1:0] lines is asserted. This selects one of the r storage cells in each of the c columns. The c S cells amplify the storage cell signals and latch the values statically. As a final step, the row of S cells drive their data back to the storage cells in the selected row. This is necessary because the sense operation is destructive. This is called implicit restore, and will occur automatically if the appropriate UpperSelect/LowerSelect and RS lines are held asserted. Thus, a row has been accessed by a sense operation.

The second step in the read transaction is to access one of the c values of the sensed row. The DQ[k][l] lines and read receiver (which drives R[k][l] line 251 in Read/Write (RW) cell 250) are initially in a precharged state (the precharging circuitry is not shown), and the column select lines, CS, are held unasserted. Column address Ac[Nc-1:0] (271) is received and decoded by the column decode (CDec) cells (e.g., 270) so that one of the CS[c-1:0] lines is asserted. This selects one of the c S cells and steers the values on the SL nodes onto the DQ lines. In other words, one driver (242) of an S cell will drive a value onto the appropriate DQ line and the other driver (241) will drive the complementary value onto the associated $\overline{DQ}$ line. This value is received by a receiver in the RW cell and is driven onto the R[k][l] line. A column has now been accessed by the read transaction.

In general, terminology such as "SL" nodes refers to both the SL and the $\overline{SL}$ node of an S cell. Similarly, "DQ lines" means the DQ and the $\overline{DQ}$ lines. This convention will be used to refer to an element and its associated complement collectively (e.g., hereinafter "BL" includes "BL" and "$\overline{BL}$").

A conventional write transaction accesses a row with a sense operation as described above. However, the second step (the column access) is different. The write data W[k][l] (252) and write enable WE[k][l] (253) signals are received by the RW cell. The DQ[k][l] lines are initially in a precharged state (the precharging circuitry is not shown) and the column select lines are held unasserted. If the write enable is asserted, then the value on the write data line is driven onto the DQ lines, otherwise the DQ lines are left precharged. Column address Ac[Nc-1:0] (271) is received and decoded by the CDec cells so that one of the CS[c-1:0] lines is asserted. This selects one of the c sense amps and steers the values on the DQ lines onto the SL nodes. If the DQ lines were asserted, the S cell latches this new value. If the DQ lines were left precharged (because the write enable was unasserted), then the S cell retains its previous value. The data in the selected row of the array of B cells must also be updated (i.e., the S cells hold a copy of the row data). This is called "write-through," and will occur automatically if the appropriate UpperSelect/LowerSelect and RS lines are held asserted. A column has now been accessed by the conventional write transaction.

Figure 3:
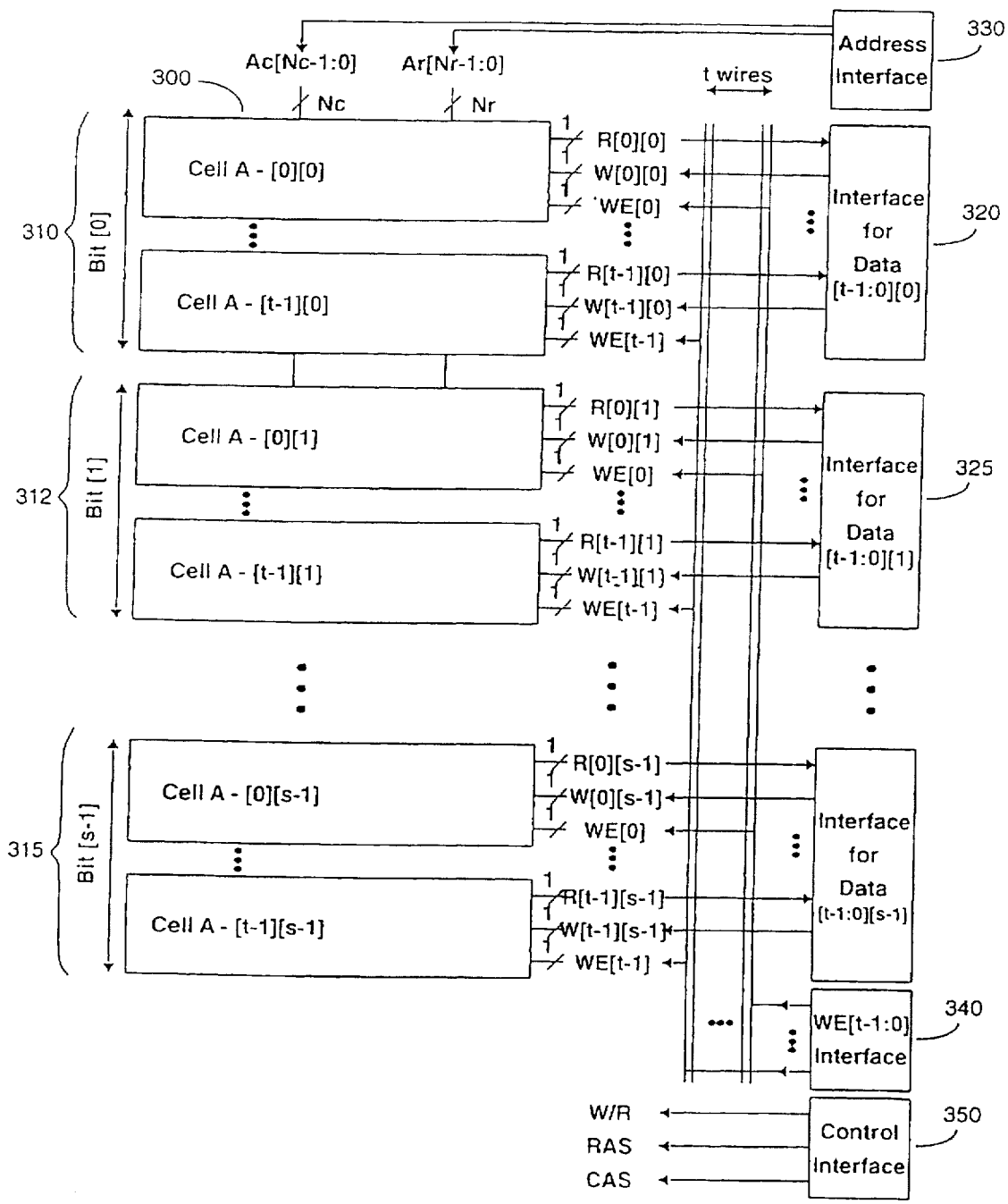
FIG. 3 illustrates a prior art DRAM including external interface and control lines.

FIG. 3 shows how the A cells are arranged in a DRAM component. In any read or write transaction a block of t×s bits of data is transferred to or from the A cells. Here s represents the number of bits in a byte, and is usually 8 or 9. The number of bytes that are transferred in each column access are represented by t. The A cells are arranged by bit; a group of t A cells form bit[0] (310), a second group of t A cells form bit[1] (312), and so on through bit[s-1] (315).

Each group of t A cells attaches to a data interface cell (e.g., 320, 325) which contains pin connections to the external system environment. There may be as many as t pins per interface cell, or as few as one, or some number in between. When there are fewer than t pins per interface cell, the interface must provide temporary storage and multiplexing and demultiplexing logic.

Another interface cell (330) drives the Ac[Nc-1:0] column address and Ar[Nr-1:0] row address signal lines. There may be a dedicated component pin for each address signal, or the address signals might be multiplexed in some fashion (for example, the row address is received first, then the column address). Alternatively the address signals might be multiplexed on the same pins used for data.

Write enable interface cell 340 drives the write enable signals. In the DRAM component that is shown, all write operations are done in units of bytes (s bits). This means that t write enable signals WE[t-1:0] will control t×s write data signals W[t-1:0][s-1:0]. If dedicated component pins are provided for write enable, then the signals must be bussed across the bit groups of the DRAM. Alternatively the write enable information may be multiplexed on the same pins used for data.

Control interface cell 350 drives the other control signals required by the DRAM. The control signals include row address strobe (RAS), column address strobe (CAS) and W/R. RAS is a strobe indicating that a sense or precharge operation is to take place. CAS is a strobe indicating that a column read or write is to take place. W/R indicates whether the column operation is read or write. In one embodiment dedicated component pins are provided for these control signals. In another embodiment, the control signals are multiplexed on the same pins used for data.

Modifications to the prior art DRAM component are necessary to support block write functionality. Although the memory features are described in the context of a DRAM component, similar changes can be applied equally well to other types of memory such as SRAM memory components.

Figure 4:
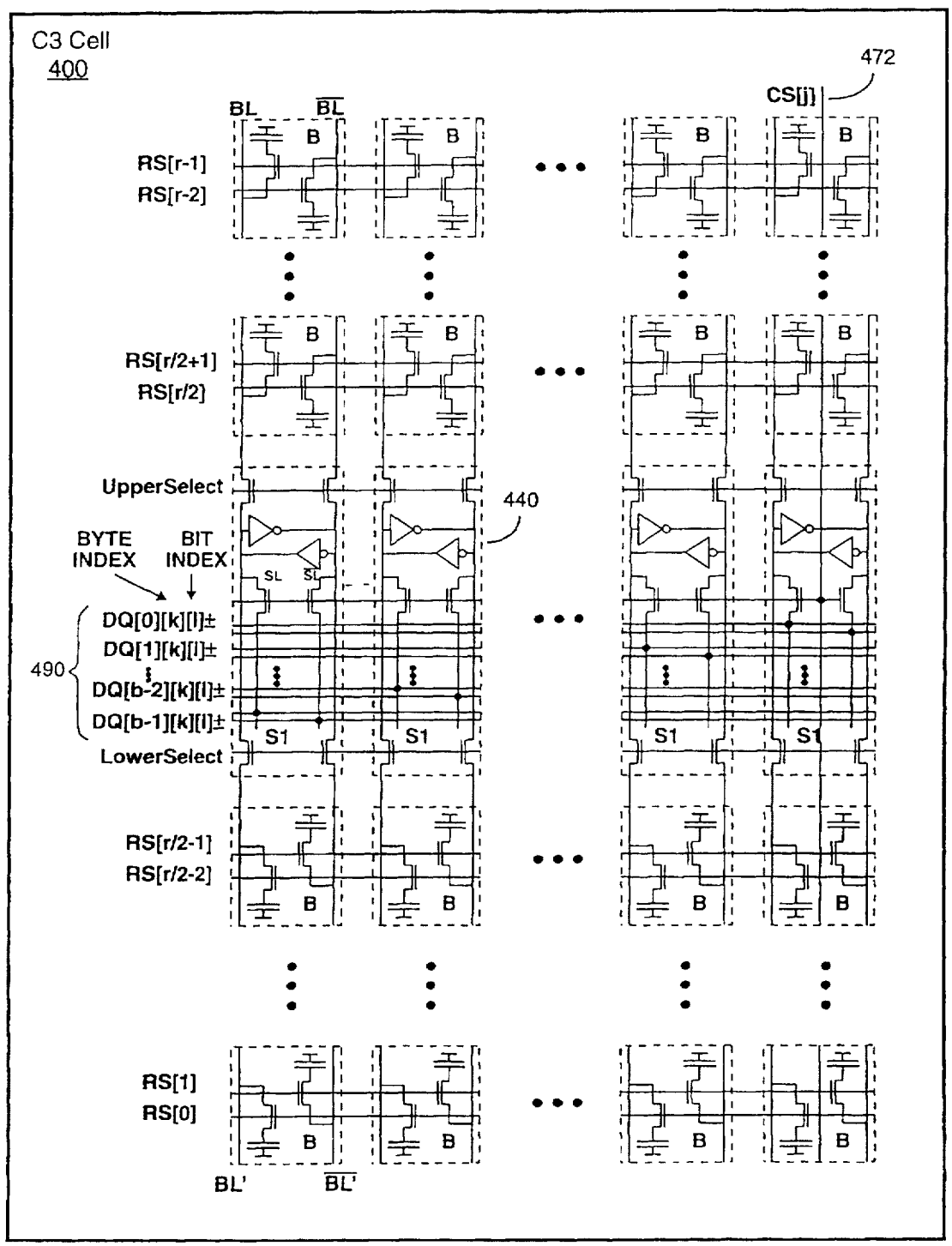
FIG. 4 illustrates a prior art block write DRAM memory array.

The C3 cell (400) illustrated in FIG. 4 shows the modifications that might be made to each S cell in order to support a one-color, maskable block write. The modifications consist of adding DQ signals 490. This example assumes that a block consists of b words, a word consists of t bytes, and a byte consists of s bits. This means that b pairs of DQ signals 490 are required in S1 cell 440. This is denoted as DQ[b−1:0][k][l] and $\overline{DQ}$[b−1:0][k][l], where k and l are the byte and bit indices, respectively. Because there are b times as many DQ signals, there can be a factor of b fewer CS signals. This is shown with the single CS[j] signal 472 that is shared by the b S1 cells in the C3 cell. The b×t/2 array of B cells is also included in the C3 cell, even though some contain the CS signal, and some do not. In FIG. 4 and subsequent figures, the complementary pair of DQ signals may be represented for example as DQ[0][k][l]+instead of DQ[0][k][l] and $\overline{DQ}$[0][k][l].

Figure 5:
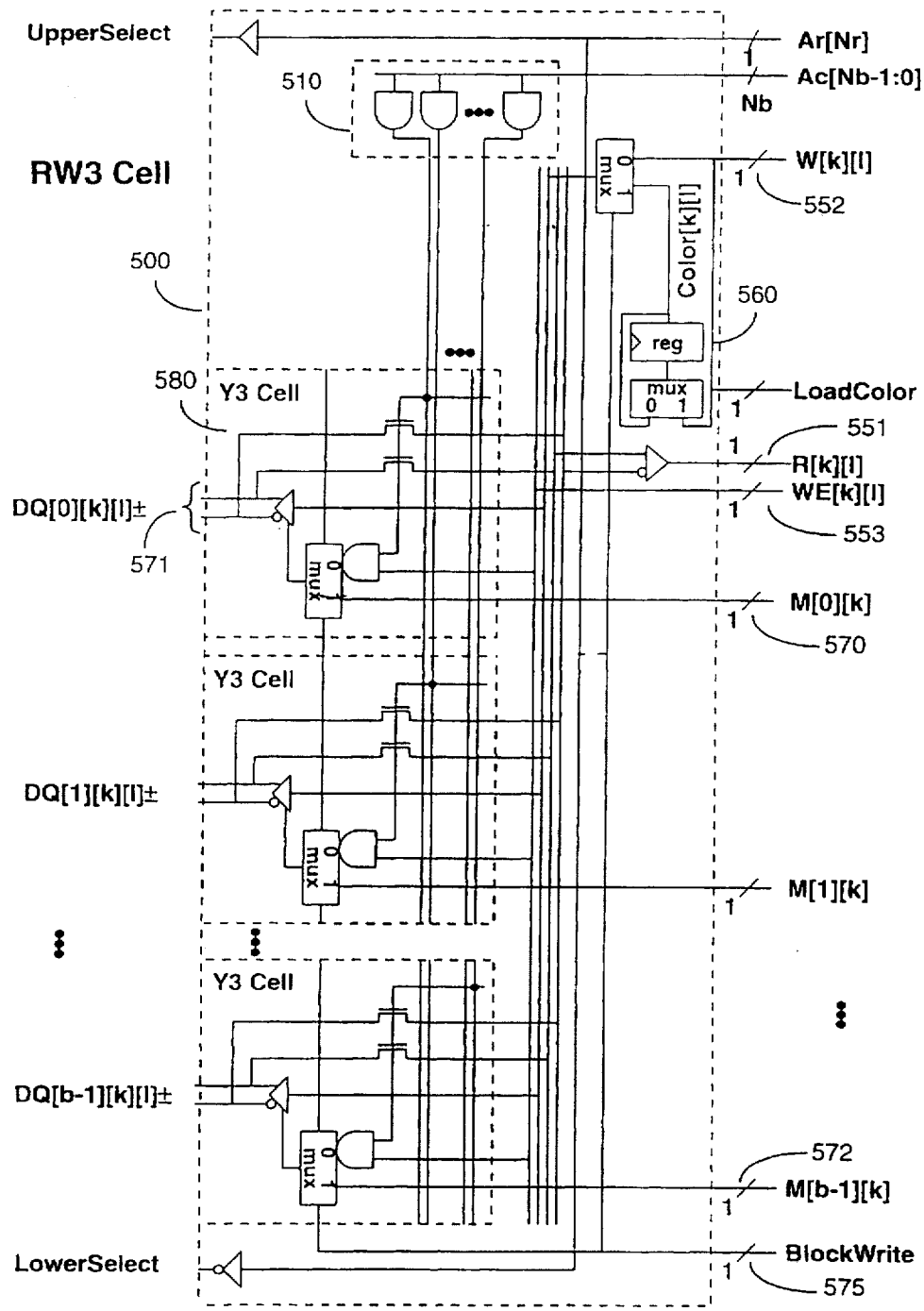
FIG. 5 illustrates a prior art block write DRAM Read/Write control circuit.

The extra DQ signals require changes in the RW cell as well. Refer to RW3 cell 500 in FIG. 5. The conventional read and write transactions generally require that only one of the DQ signal pairs be selected using the Ac[Nb−1:0] address bits. Each DQ signal pair is associated with a Y3 cell such as 580. The selection is accomplished with the set of decoders 510 at the top of cell RW3 500 which selects one of the Y3 cells to steer the appropriate DQ signal to R[k][l] or alternatively to steer W[k][l] onto the appropriate DQ line. For a conventional read or write BlockWrite signal 575 is deasserted. This steers the appropriate DQ signal to R[k][l] signal 551, or alternatively steers W[k][l] 552 onto the appropriate DQ line. In the case of a conventional write transaction, the appropriate DQ write driver is enabled by WE[k][l] signal 553.

For a block write, a color value must first be loaded into the Color[t−1:0][s−1:0] register. This is done by placing the color value on W[t−1:0][s−1:0] and asserting the LoadColor signal. There is one bit of the Color register (e.g., 560) in each RW3 cell. This is the value that may be driven onto each of the b DQ signals during a block write. Whether or not each DQ signal is driven depends upon the mask bits M[b−1:0][k] (e.g., M[0][k] 570 thru M[b−1][k] 572). Each mask bit is steered to the enable inputs of the b write drivers when the BlockWrite signal is asserted. This signal also steers the Color[k][l] bit to the data input of the b write drivers.

Figure 6:
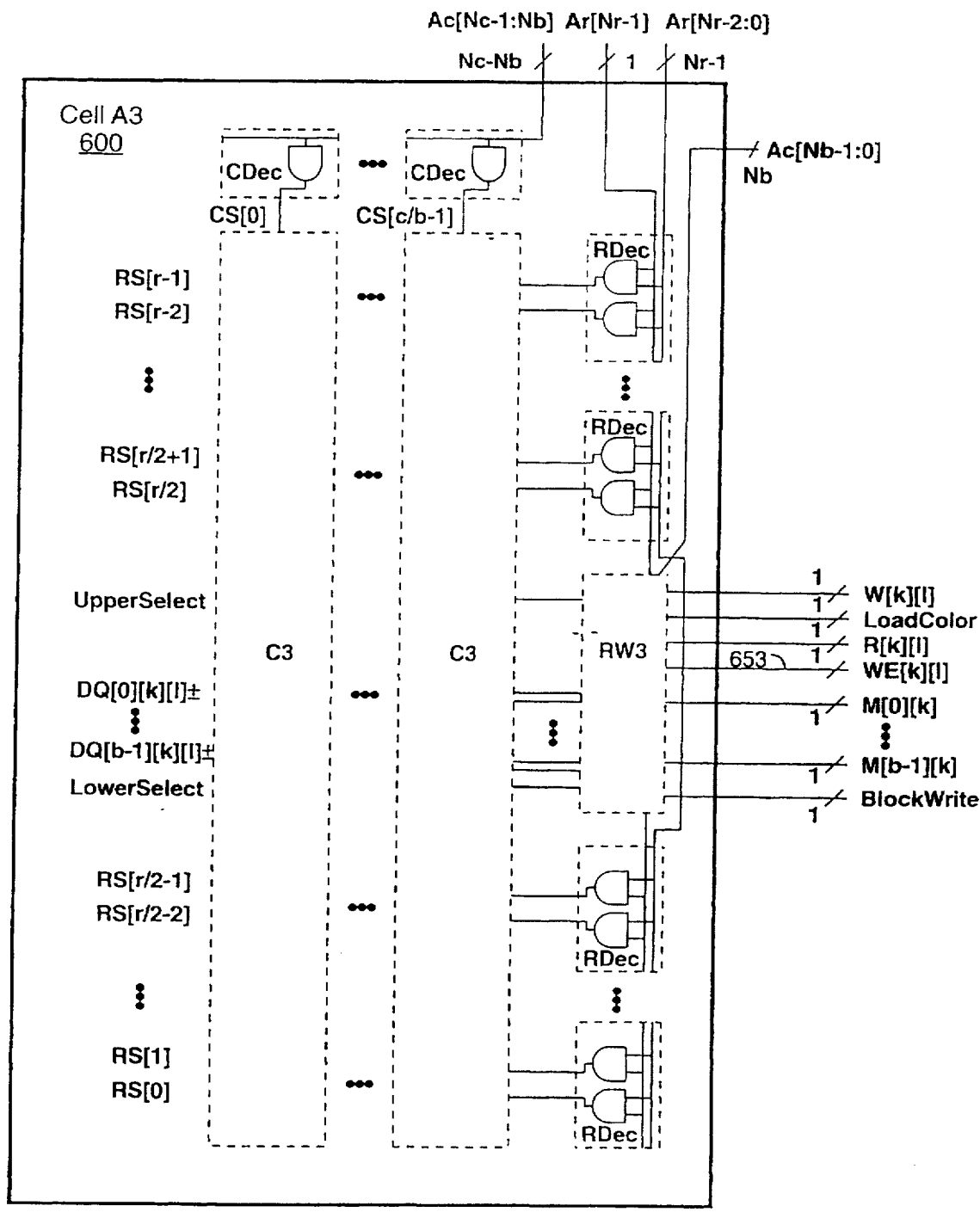
FIG. 6 illustrates a prior art block write DRAM including the memory array and the Read/Write control circuit.
Figure 7:
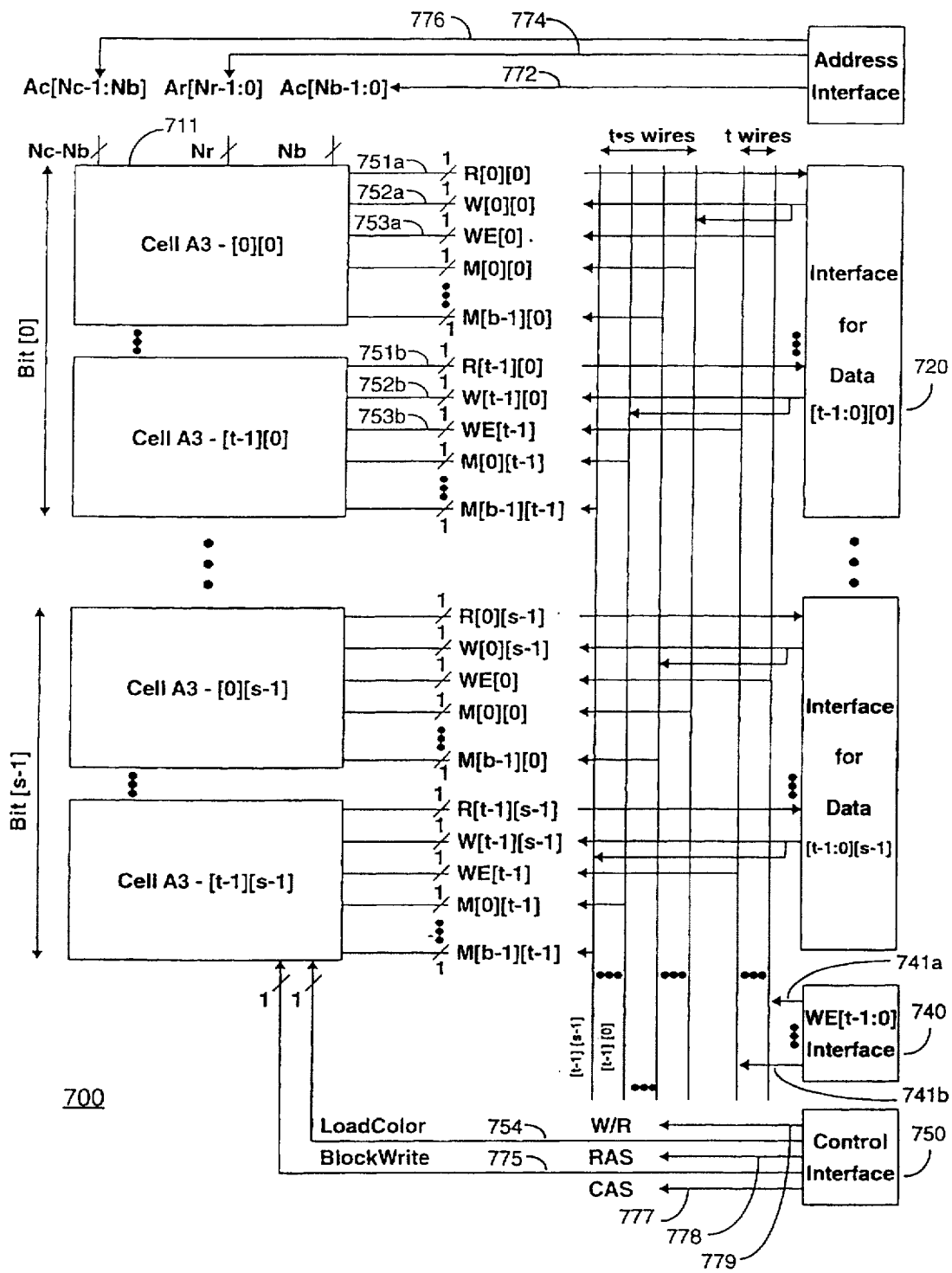
FIG. 7 illustrates circuitry including external interface and control lines for a prior art DRAM having maskable block write functionality.

The C3 cells and RW3 cell are assembled into an A3 cell 600 in FIG. 6. FIG. 7 illustrates DRAM 700 composed of A3 cells. As in the previous DRAM, there are s groups of t A3 cells, with the grouping done according to the bit index. Each of the groups lines up with an interface cell. The R[k][l] (e.g., 751a thru 751b) and W[k][l] (e.g., 752a thru 752b) signals travel a short distance between A3 cell 711 and corresponding interface cell 720.

The write enable signals, WE, control the writing of whole bytes, as before. WE[t−1:0] signals 741a thru 741b are bussed from interface cell 740 across one side of the DRAM so that all t signals (753a thru 753b) may be used by each group of t A3 cells.

The address interface drives the Ar[Nr−1:0] (774), Ac[Nc−1:Nb] (776), and Ac[N1:0Nb] (772) signals, which are distributed to all the A3 cells. Control interface 750 drives the W/R (779), RAS (778), and CAS (777) signals, as before. The control interface also drives the LoadColor 754 and BlockWrite 775 signals, which are distributed to all the A3 cells.

The one-color, maskable block write requires b×t mask bits M[b−1:0[t−1:0]. The source for the mask is the t×s bits of the write data bus W[t−1:0][s−1:0], which are available in each write operation. The write data bus is shown as 710. This requires that b (the number of words per block) be less than or equal to s (the number of bits per block). If b, t, and s are all chosen to be equal for the block write, then the mapping between the write data bus and mask data bus might be easier.

Figure 8:
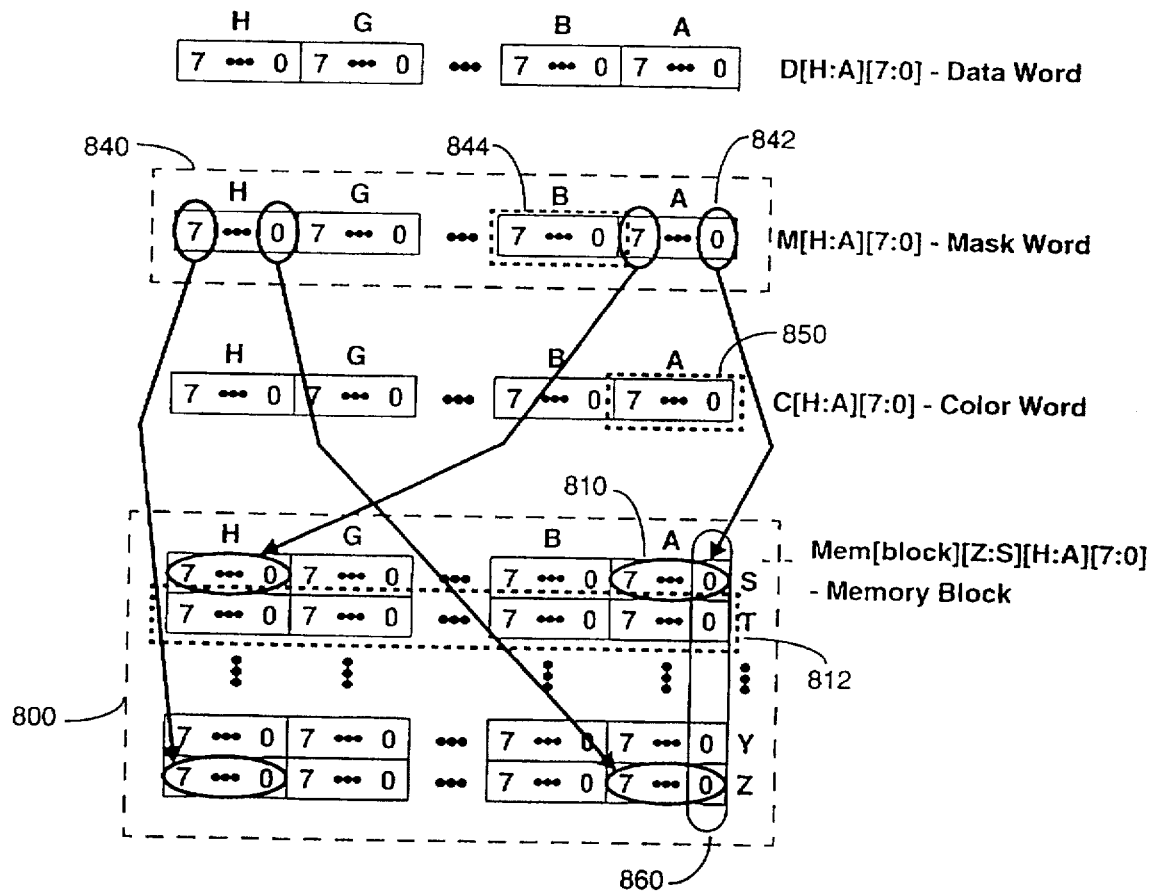
FIG. 8 illustrates the mapping between the mask word and a memory block for the prior art one-color maskable block write function.
Figure 9:
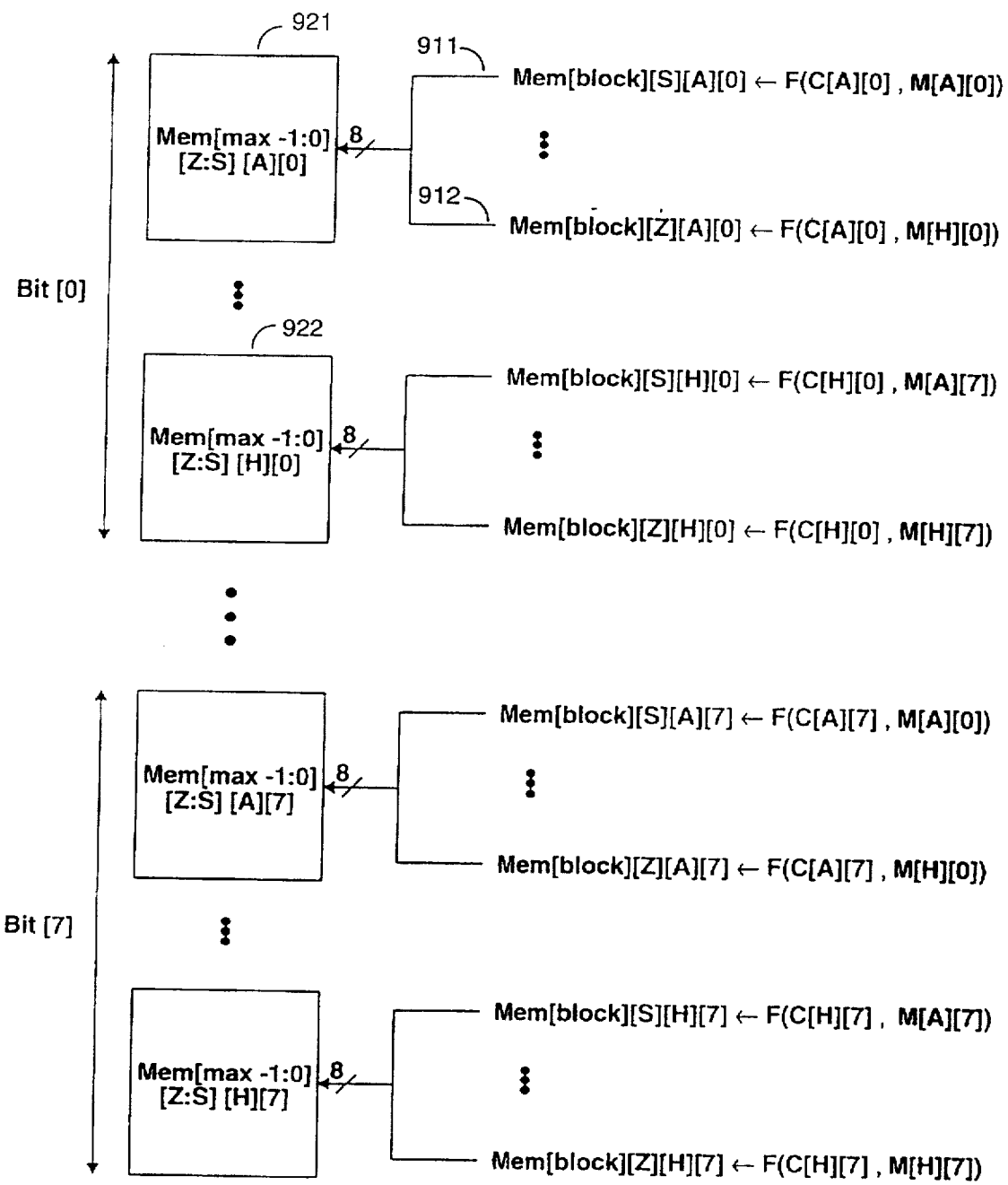
FIG. 9 shows how the mask word maps to the memory arrays for each column operation for the prior art one-color maskable block write function.

An example of this is shown in FIGS. 8 and 9. FIG. 8 illustrates a mapping where b, t, and s are all equal to eight. To make the mapping of bits, bytes, and words more clear, a different set of enumeration values is used for each of the three indices. The digits {7, 6, . . . , 1, 0} are used for the bit index, the letters {H, G, . . . , B, A} are used for the byte index, and the letters {Z, Y, . . . , T, S} are used for the word index. Thus in this embodiment a byte is eight bits and a word is eight bytes. In addition, a block is defined as eight words (b) which are aligned to an eight word boundary. Each block is thus 64 bytes (512 bits) in size. The DRAM receives a new block address (Ar [Nr−1:0], Ac[Nc−1:Nb ]) and mask word (M[b−1:0][t−1:0]) for each column write operation.

Each mask value may often be referred to as a "mask word". Similarly bit positions in the "color register" might be referred to as bit positions in the "color word". Neither the width of the mask value nor the width of the color register necessarily corresponds to the same width as a word in the memory block.

Each bit (842) in mask word 840 controls how a byte (810) is written in memory block 800. Thus a byte (844) of mask word 840 controls how each word (812) of memory block 800 is written. For example, bit 842 will determine whether or not byte 850 of the color word is written into byte 810 of the memory block.

FIG. 9 shows how the mask word maps to the memory arrays for each column write operation. There are s (s=8) groups of t (t=8) memory arrays, with each array corresponding to the A3 cell already described. There are b (b=8) mask bits sent to each array in each column write operation. Note that although the bit and byte index of each color value C matches the bit and byte indices of the Mem array, the bit and byte indices of the mask value do not match; each group of t A3 arrays use all b×t mask values. This requires bussing all of the mask bits across the DRAM component to reach all s groups. For example, referring to FIG. 8, 860 represents eight bits which are associated with one A3 cell. However, they also represent bit zero of different words in memory, thus each bit zero of 860 is not associated with the same bit zero in mask word 840. Instead, each bit zero of 860 is associated with the bit zero 842 of each byte (e.g., 844) of mask word 840. Thus the mask word is composed of b bytes.

Referring to FIG. 9, bit zero of byte A of words S thru Z is shown as 921. This is the equivalent of 860 in FIG. 8. Similarly bit zero of byte H of words S thru Z is shown as 922. Column 921 of the block requires the zeroeth bit of bytes A (911) thru H (912) of mask word 840. Column 922 (representing all bit zeroes of each word in the eighth byte, H) requires bit seven from bytes A thru H of the mask word 840.

The new memory contents (Mem$^{New}$) are a boolean function, F, of the mask bits M, color bits C, and previous memory contents (Mem$^{Old}$) such that:

$Mem_{[block][j][k][7:0]}^{New} = F(Mem_{[block][j][k][7:0]}^{Old}, M_{[0][0][j][k]}, C_{[0][0][k][7:0]})$ where indices j and k have the following ranges:

j={7,6,5,4,3,2,1,0}
k={7,6,5,4,3,2,1,0} and F(A, B, C)=A·B+C·$\overline{B}$ such that:

$Mem_{[block][j][k][7:0]}^{New} = Mem_{[block][j][k][7:0]}^{Old} \cdot M_{[0][0][j][k]}$
$+ C_{[0][0][k][7:0]} \cdot \overline{M}_{[0][0][j][k]}$ where the "•" symbol represents the logical (boolean) "AND" operator, and the "+" symbol represents the logical "OR" operator.

Note the subscripting order descends from block, to word, to byte, to bit (e.g., $\text{Mem}^{New}[\text{block}][j][k][7:0]$). The indices "j" and "k" represent word and byte indices, respectively, for the memory blocks and the same indices represent byte and bit positions for the mask word. Thus each bit of the mask word controls a byte of the memory block and each byte of the mask word controls a word in the memory block. The bit ([7:0]) and byte ([k]) subscripts of the color word and the memory block indicate that there is a bit-to-bit correspondence between each word "j," in the memory block and the color word.

Because the same index might refer to different units of data for different variables, the variables representing the memory block, mask value, and color register ($\text{Mem}^{New}$, $\text{Mem}^{Old}$, M, C) above have each been given four subscript positions in order to avoid confusion with respect to whether a given subscript position indicates a block, word, byte, or bit. This is because a subscript index such as "j" might refer to a byte position for one variable and a word position for another variable.

As stated above, each mask value may often be referred to as a "mask word". Similarly bit positions in the "color register" might be referred to as bit positions in the "color word". For this embodiment, the mask value and the color register are each only as wide as a word of memory in the block, therefore the block and word subscripts for each of them is denoted as "[0]." Neither the width of the mask value nor the width of the color register necessarily corresponds to the same width as a word in the memory block. The subscript positions that correspond to "word" positions for the memory block correspond to a particular mask value when referring to the mask or a particular "register" for the color values. With this understanding, four subscripts will continue to be used where possible to clearly distinguish between block, word•register•value, byte, and bit positions.

One alternative function is two-color, non-maskable block write. The individual bits of the mask value M[k][l] may by used to control which of two color register values is written into each memory byte. Every byte of the memory block is written with one of the two values. This is the two-color, non-maskable block write function.

Figure 10:
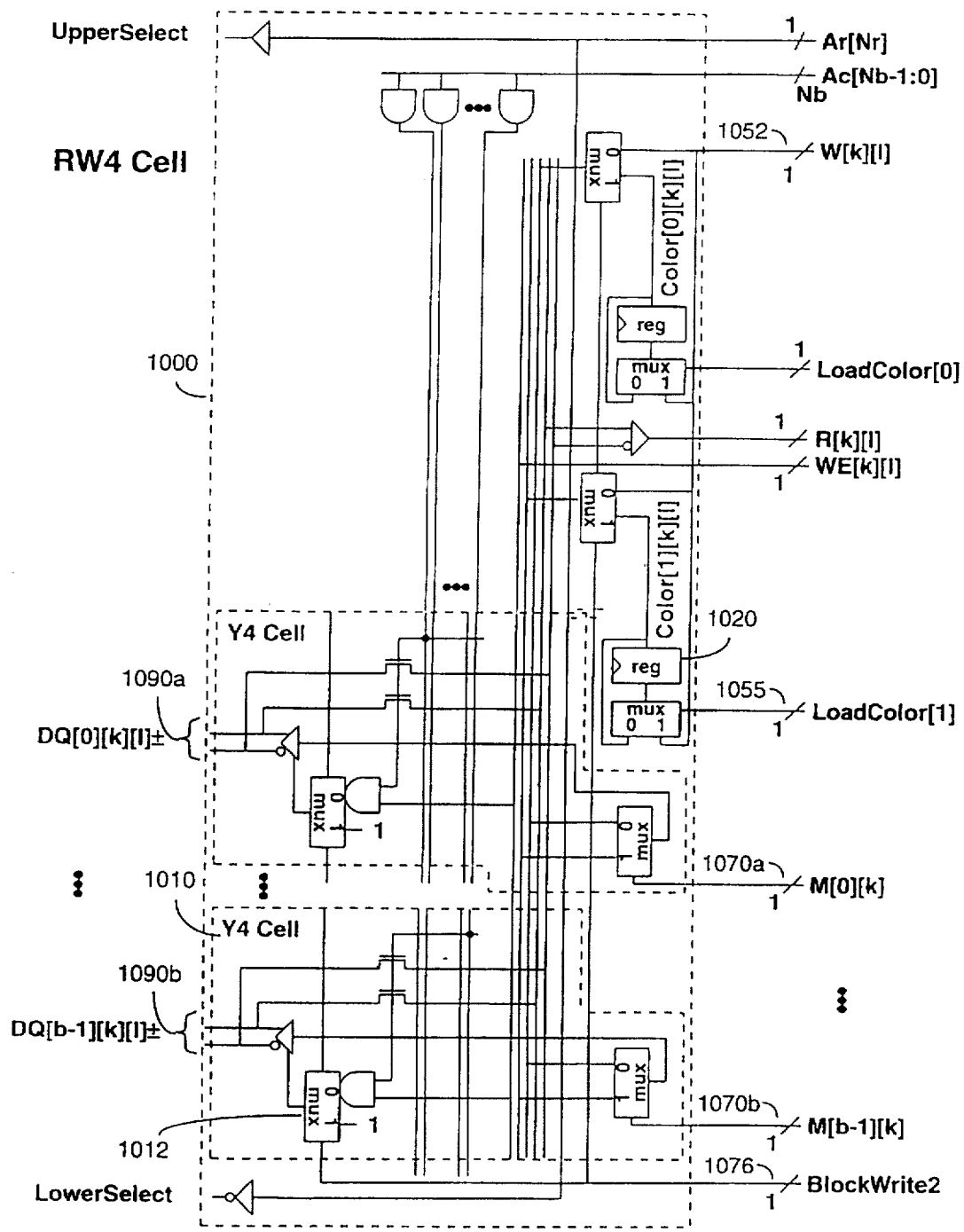
FIG. 10 illustrates read/write control circuitry for a prior art two-color non-maskable block write DRAM.

FIG. 10 shows how this function is implemented in RW4 cell 1000. The cell has been modified to perform two-color, non-maskable block writes. The original one-color, maskable block write functionality is not shown. However both the two-color, non-maskable and the one-color, maskable block write functions might be implemented for maximum flexibility. A second BlockWrite Signal might be necessary such that the signal used to implement one function could be BlockWrite1 and the other function could use BlockWrite2. The circuitry necessary to merge these functions together is not complex and might be accomplished using multiplexers controlled by the BlockWrite1 and BlockWrite2 signals.

For the two-color, non-maskable block write, there is a second color register Color[0][1][k][l] 1020 which is loaded from W[k][1] signal 1052 (like the first color register) when LoadColor[1] signal 1055 is asserted. The two-color, non-maskable block write function is enabled when BlockWrite2 signal 1076 is asserted. This permits the Color[0][1:0][k][l] bit values to be driven onto two lines within the RW4 cell. The M[0][0][b−1:0][k] signals (1070a thru 1070b) control b multiplexers which select between the two color values and drives one of them onto the DQ[b−1:0[k][l] signal lines (1090a thru 1090b). The write drivers, such as 1012, in the b Y4 cells (e.g., 1010) are all enabled by BlockWrite2 signal 1076.

For the two-color, non-maskable block write function, the new memory contents ($\text{Mem}^{New}$) are a boolean function, F2, of the mask bits M, previous memory contents ($\text{Mem}^{Old}$), and the color registers, such that:

$$\text{Mem}_{[block][j][k][7:0]}^{New} = F2(M_{[0][0][j][k]}, C_{[0][0][k][7:0]}, C_{[0][1][k][7:0]})$$

where the indices j and k have the following ranges:

j={7,6,5,4,3,2,1,0} k={7,6,5,4,3,2,1,0} and F2(A, B1, B2) is equivalent to $B1\cdot A+B2\cdot \overline{A}$ such that $$\text{Mem}_{[block][j][k][7:0]}^{New} = C_{[0][0][k][7:0]}\cdot M_{[0][0][j][k]}+C_{[0][1][k][7:0]}\cdot \overline{M}_{[0][0][j][k]}$$

where the "M" symbols represents the mask value, the color registers are distinguished by a "0" or a "1" in their "word" index, the "•" symbol represents the logical "AND" operator, and the "+" symbol represents the logical "OR" operator.

With the above understanding, the modifications necessary to implement multiple-color, maskable block write functionality at the device level can be addressed.

If two or more mask bits control each byte written to memory, then more complex control is possible. As an example, consider the case of two bit control. Each pair of mask bits M[0][0][k][l+1:1] might control the writing of a kth byte of a given color register into a byte of memory.

For example, each mask bit pair might select a byte to be written from one of three color registers, or whether the memory byte is not changed. One possible disadvantage is that the block write bandwidth is not as high as with single bit control. In other words, with two mask bits instead of one mask bit being used to control each byte written the number of mask bit pairs will be less than the number of mask bits and so total number of controlled bytes that can be written will correspondingly be reduced when using multiple bits to control each written byte.

A representative control bit function table for the multiple bit control might be:

TABLE 2

| Mask control bits | Function |
|---|---|
| 00 | use color register 0, C0 |
| 01 | use color register 1, C1 |
| 10 | use color register 2, C2 |
| 11 | no write |

Figure 11:
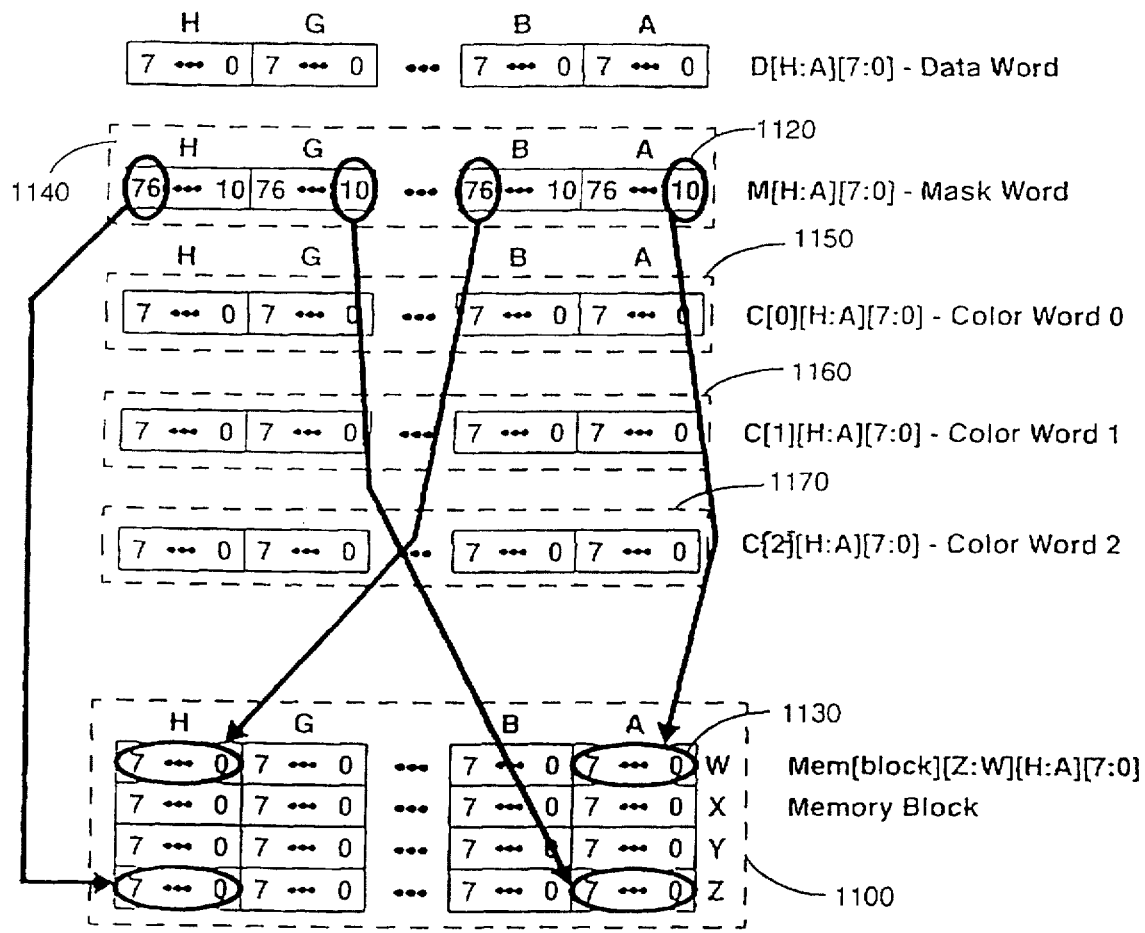
FIG. 11 shows how a mask word maps to a memory block for the multiple-color maskable block write function.

FIG. 11 illustrates a mapping of the mask bit pairs (1120) from mask word 1140 for controlling the bytes written to memory block 1100. In FIG. 11, the values of s, t, and b are 8, 8, and 4, respectively. This is similar to FIG. 8 except for the value of b, which has been reduced by a factor of two. This is because the number of bits controlling the writing of each byte has been increased by a factor of two. Each bit pair (1120) selects a byte to be written to a byte (1130) in the memory block from one of color registers 1150, 1160, or 1170.

Figure 12:
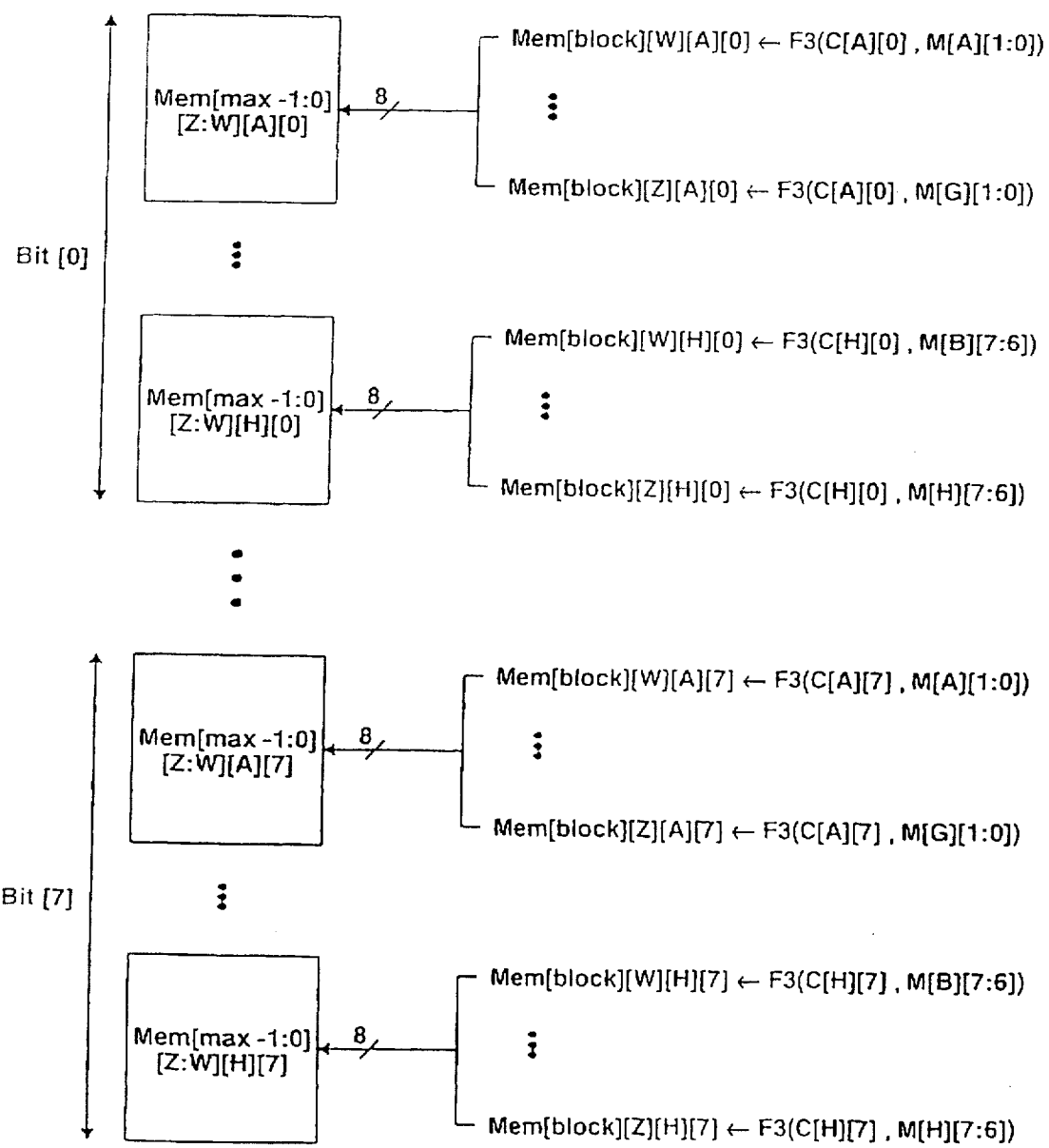
FIG. 12 shows how the mask word maps to the memory arrays for each column operation in the multiple-color non-maskable Block Write DRAM.

FIG. 12 shows how the mask bits map to the memory bytes. This is similar to FIG. 9.

The new memory contents ($\text{Mem}^{New}$) are a boolean function, F3, of the mask bits M, and the color registers C0, C1, and C2 such that:

$$\text{Mem}_{[block][j][4m+n][7:0]}^{New} = F3(\text{Mem}_{[block][j][4m+n][7:0]}^{Old}, M_{[0][0][2j+m][2n+1:2n]}, C_{[0][0][4m+n][7:0]})$$

The three indices shown have the following ranges:

j={3,2,1,0}
m={1,0}
n={3,2,1,0}

The masking and color selection functions can be merged into one operation by using variables M00, M01, M10, and M11 that represent the four decoded values of the two-bit mask field for each pair of mask bits as shown in Table 3. As index n varies, M00, M01, M10, and M11 will refer to a different pair of bits.

TABLE 3

| Value of $M_{[0][0][2j+m][2n+1:2n]}$ | Decoded Value | | | | Function |
|---|---|---|---|---|---|
| | $M_{00}$ | $M_{01}$ | $M_{10}$ | $M_{11}$ | |
| 00 | 1 | 0 | 0 | 0 | use $C_{[0][0][4m+n][s-1:0]}$ |
| 01 | 0 | 1 | 0 | 0 | use $C_{[0][1][4m+n][s-1:0]}$ |
| 10 | 0 | 0 | 1 | 0 | use $C_{[0][2][4m+n][s-1:0]}$ |
| 11 | 0 | 0 | 0 | 1 | no write |

Thus a given pair of mask bits (j=0, m=0, n=0), the expression for the affected portion of the memory block becomes:

$$Mem_{[block][j][k][7:0]}^{New} = Mem_{[block][j][k][7:0]}^{Old} \cdot M_{11} + C2 \cdot M_{10} + C1 \cdot M_{01} + C0 \cdot M_{00}$$

where C0, C1, and C2 represent Color registers 0, 1, and 2, respectively.

Merging the masking and color selection functions into one operation helps to avoid the granularity issue discussed in regard to the two-color, non-maskable block write. Specifically, the two-color nonmaskable block write operation must write either a foreground or background color into each byte throughout an entire block. In the example discussed (with the values of s, t, and b set to 8, 8, and 8, respectively) means that a 64 byte block is written. If the region that is being filled does not align to a block boundary, the edges of the region must be handled as a special case. Small regions may not be able to use the two-color block write at all.

The edges and small regions could be handled with two passes of the one-color, maskable block write. The two passes would reduce the writing bandwidth by a factor of two, the same as the bandwidth of the multiple color, maskable block write (two bits of control per byte). However, the multiple-color, maskable block write requires half as many DQ signals in the sense cell. From a fabrication viewpoint, a reduction in the number of DQ signal lines might be preferable.

If small regions tend to account for much of the drawing operations in typical graphics applications or benchmarks, a DRAM implementation with the multiple-color, maskable block write function might provide about the same performance as an implementation with the two single-bit functions (one-color, maskable and two-color, non-maskable). However, because of the fabrication costs of the extra DQ signals in the sense cells, the incremental cost of the multiple-color, maskable implementation might be approximately one-half as much as the alternate implementation, relative to a DRAM without block write.

Another advantage of block write with two or more bits of control per byte written is the ability to select between more than just the two colors (foreground and background). Typically, a block write is used to draw text (foreground color) in a rectangular region (background color). However, the appearance of the text is improved if there is blending of the pixels at the edge of each text character (anti-aliasing). This requires that one or more color values be available which are interpolated from the fore-round and back-round colors. Two control bits provide for selecting between the foreground and background colors, one interpolated color, and no write. This interpolated color might be determined by averaging the foreground and background colors. Three or more control bits per byte written would provide for more interpolated colors, further improving the appearance of the characters.

Block Write with Deeper Pixels

The embodiments presented above illustrated using one byte of memory to represent one pixel. However, the multiple-color maskable block write function can treat each byte of a pixel identically if the pixel consists of two or more bytes.

If each pixel consists of $2^n$, bytes of memory (where n is an integer greater than zero), then the two mask bits could be allocated to control the writing of each pair of bytes. This would permit a multiple-color, maskable block write (with the advantages already discussed), but which could write into memory at eight times the rate of the normal write operation. A representative function table for a two-byte pixel (n=1) might be:

TABLE 4

| Value of $M_{[0][0][j][2k+1:2k]}$ | Decoded Value | | | | Function for $Mem_{[block][j][2k+1:2k][s-1:0]}$ |
|---|---|---|---|---|---|
| | $M_{00}$ | $M_{01}$ | $M_{10}$ | $M_{11}$ | |
| 00 | 1 | 0 | 0 | 0 | use $C_{[0][0][2k+1:2k][s-1:0]}$ |
| 01 | 0 | 1 | 0 | 0 | use $C_{[0][1][2k+1:2k][s-1:0]}$ |
| 10 | 0 | 0 | 1 | 0 | use $C_{[0][2][2k+1:2k][s-1:0]}$ |
| 11 | 0 | 0 | 0 | 1 | no write |

In other words, each mask bit pair selects which two bytes from one of three color register values are written, or whether the memory byte-pair is not changed.

This extension to the block write functionality can be applied to a DRAM with any combination of the values of s, t, and b. Similarly, this functionality could be applied to a DRAM in which the minimum pixel size was four bytes, or any larger number of bytes that is a power-of-two. In this case, there would be more control bits available in the mask value for the control of each pixel. Alternatively, in any of these cases, the block write bandwidth might be s times the bandwidth of the normal write operation. For the specific case of a two byte minimum pixel size, the block write bandwidth might be two times greater than the normal block write bandwidth, s (i.e., the block write bandwidth would be 2×s).

Figure 13:
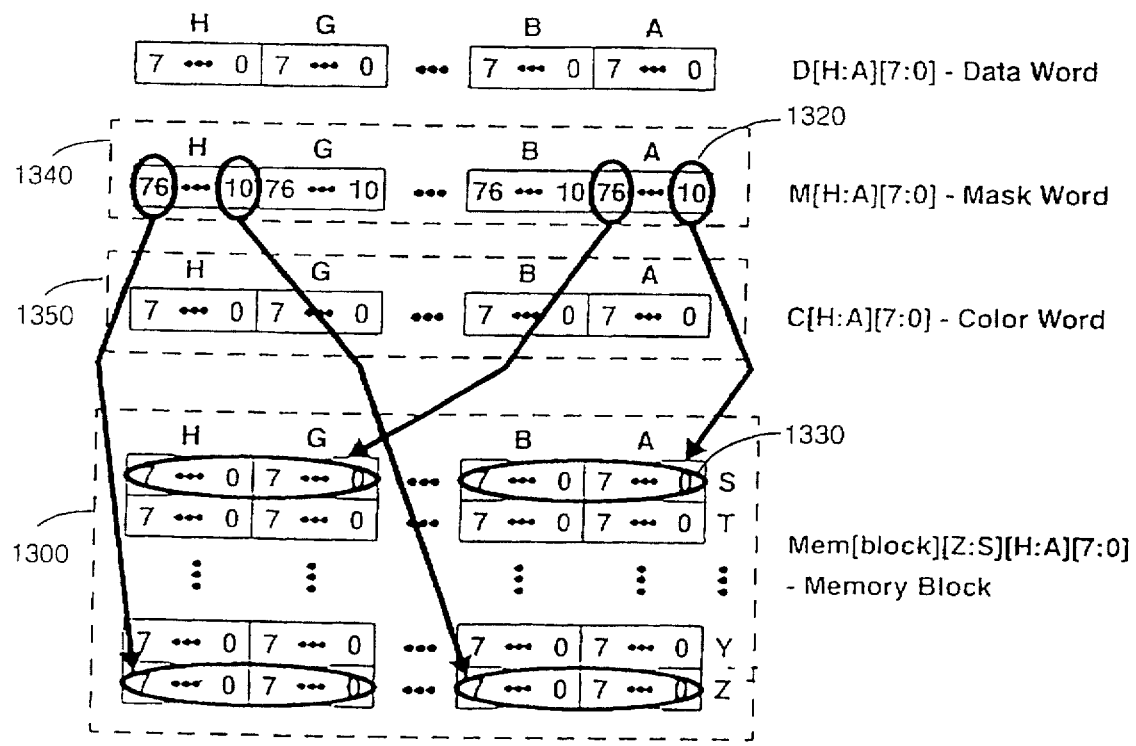
FIG. 13 shows the mask word mapping to a memory block when a power-of-two number of bytes are required per pixel.

FIG. 13 illustrates a conceptual mapping of the mask bit pairs (1320) for controlling the bytes (1330) written to memory block 1300. The values of s, t, and b are 8, 8, and 8, respectively. Each bit pair 1320 of mask word 1340 controls the writing of a pixel 1330 from color register 1350 into block 1300. Each pixel 1330 is made up of two or more bytes.

Figure 14:
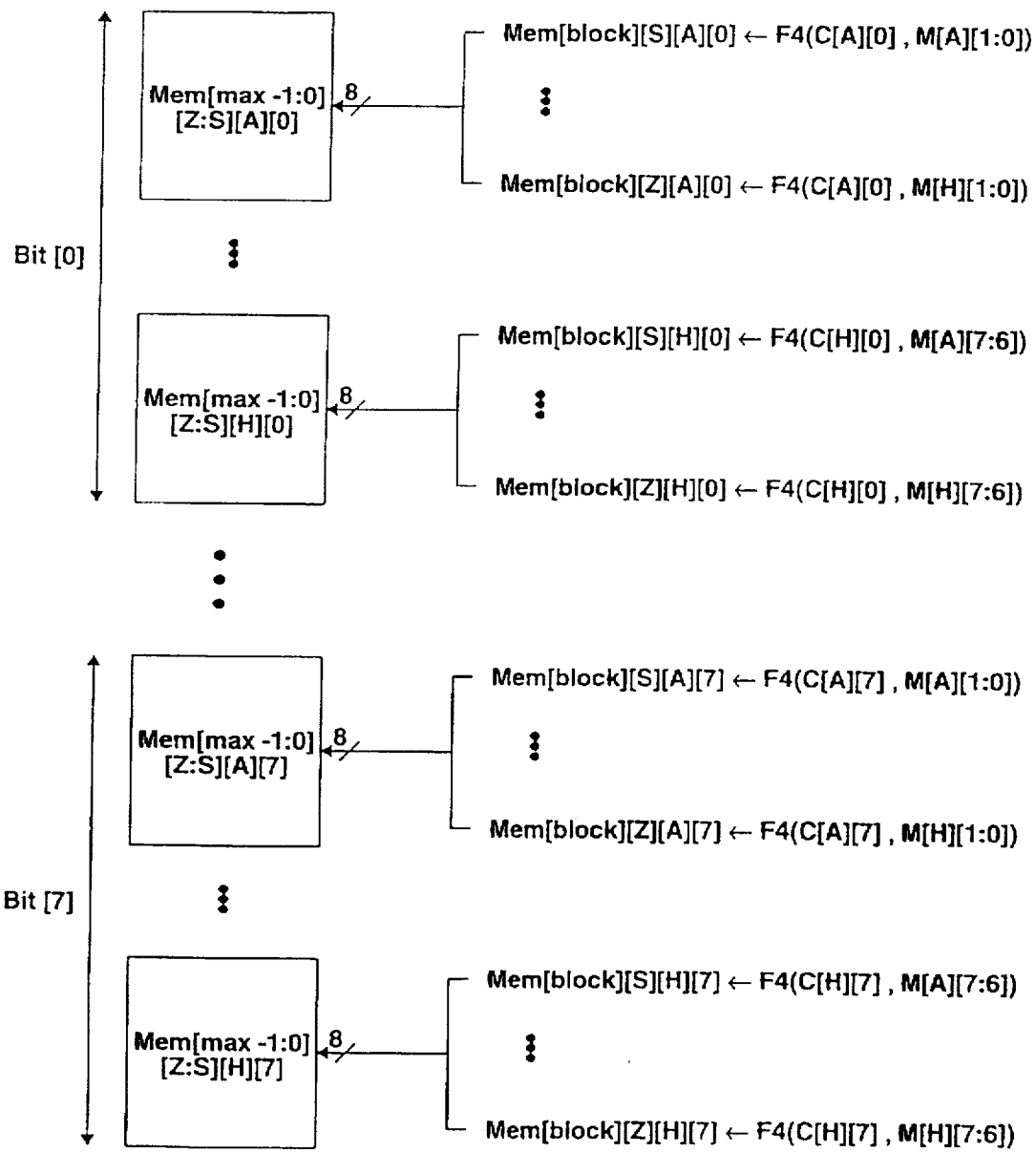
FIG. 14 shows the mask and color word bit mapping to a memory block when a power-of-two number of bytes are required per pixel.

FIG. 14 shows how the mask bits physically map to the memory bytes for a block write with deeper pixels when the values of s, t, and b are set to 8, 8, and 8, respectively in the bit-arranged DRAM.

The new memory contents are a function of the old memory contents, the mask word, and the color words. Thus for a given pair of mask bits the mapping illustrated in FIG. 14 may be expressed as:

$$Mem_{[block][j][2k+1:2k][7:0]}^{New} = F4(Mem^{Old}, M, C) = Mem_{[block][j][2k+1:2k][7:0]}^{Old} \cdot M_{11} + C2 \cdot M_{10} + C1 \cdot M_{01} + C0 \cdot M_{00}$$

where j and k have the following ranges:

j={7,6,5,4,3,2,1,0}
k={3,2,1,0}

As the number of colors available increases in a graphics system the number of bits required to represent those colors also tends to increase. The total range of colors achievable by a graphics system may be referred to as the color space. With only one byte per pixel, up to 256 color values may be supported for the entire color space. However, with two bytes per pixel, 65,536 color values can be supported because 16 bits are available for representation. Thus the greater number of bits provides for interpolation at finer intervals than 1/256th of the entire color space. This in turn tends to increase the perceived continuity of the colors.

A color model allows convenient specification of colors within some color space. Examples of color models include Red-Green-Blue (RGB), Hue-Saturation-Brightness (HSB), Hue-Lightness-Saturation (HLS), and the CIE models. The RGB color model is particularly suited for graphics display systems. In one embodiment, a system uses the RGB color model and 16-bits to describe each pixel. Each of the three color components (red, green, and blue) are represented by at least five bits (one component may have six bits). The five or six bits control the amount of each color component in the pixel. This permits a greater choice of colors to be used when interpolating between colors. Thus an interpolated pixel may be selected from one of 65,536 possible color values instead of one of 256 color values in the same color space. Applications where such interpolation might be useful include antialiasing, aliasing, object shading, or fading in one object while fading out another object.

The use of $2^n$ bytes per pixel to represent colors (where n>0) will permit either: (1) more mask bits to be used as control bits for each pixel value written to memory; or (2) a larger bandwidth increase of block write relative to conventional write (i.e., a greater number of bytes written for a given write operation) as compared to the block write function for the one-color, maskable block write.

Block Write with Non-Power-of-Two Pixel Depth

Figure 15:
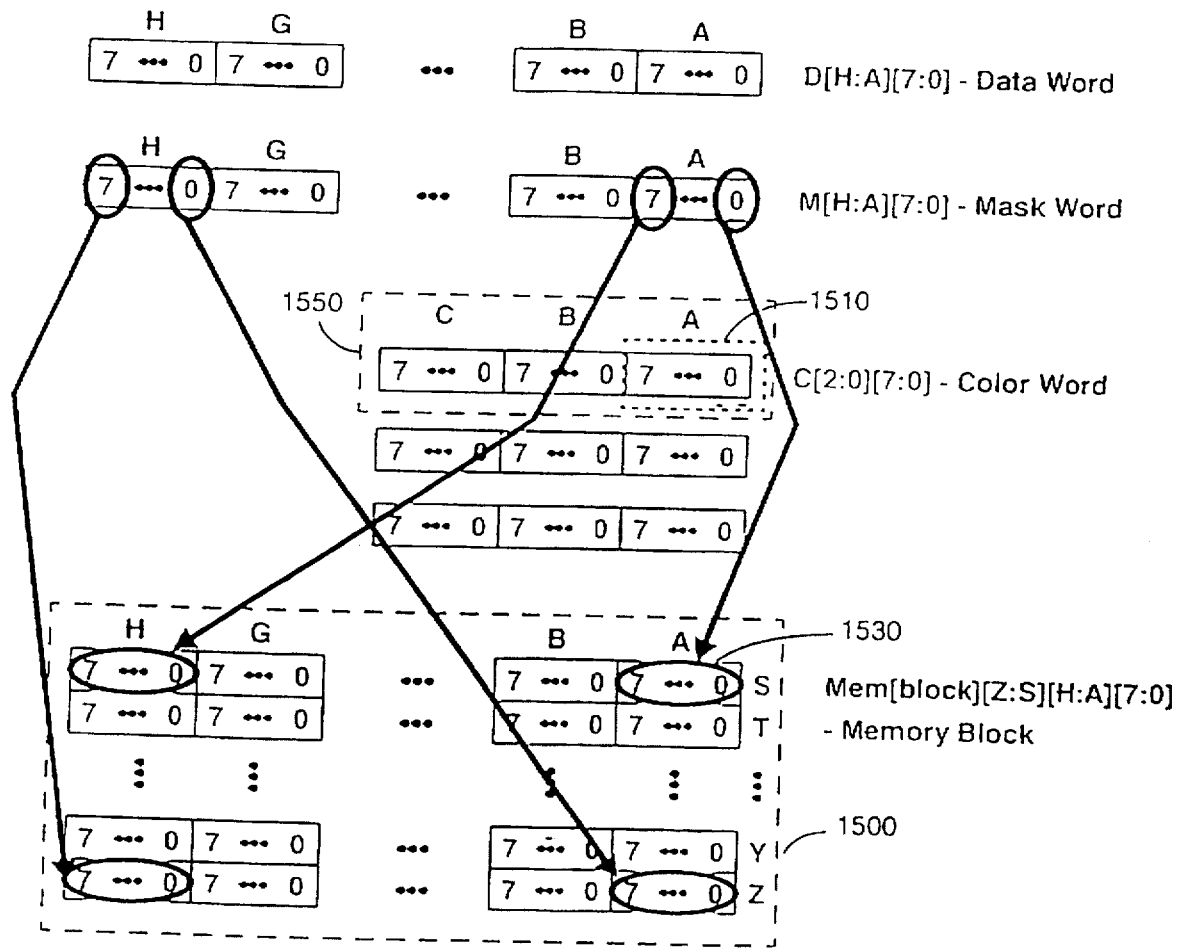
FIG. 15 illustrates the mask value mapping when three bytes are required per pixel.

One way of representing a pixel in the RGB color model is to use three bytes per pixel. Three bytes per pixel allows each byte to be associated with one of the three color components (red, green, and blue). Using one or more bits in the mask value to control a non-power-of-two number of bytes in the block requires modifications to the RW cell. FIG. 15 illustrates the notation used to describe such a system for the specific case when s, t, and b are set to 8, 8, and 8, respectively. Each bit 1520 of the mask word controls the writing of one byte (1510) from one of the color words (1550) to one byte 1530 of a three byte pixel in memory block 1500. Thus 3 bits from the mask word are used to control the writing of each three byte pixel in memory block 1500. The principle difference between FIG. 15 and previous figures is that each color word (1550) is only three bytes long in FIG. 15 rather than eight bytes as illustrated in the other figures.

Figure 16:
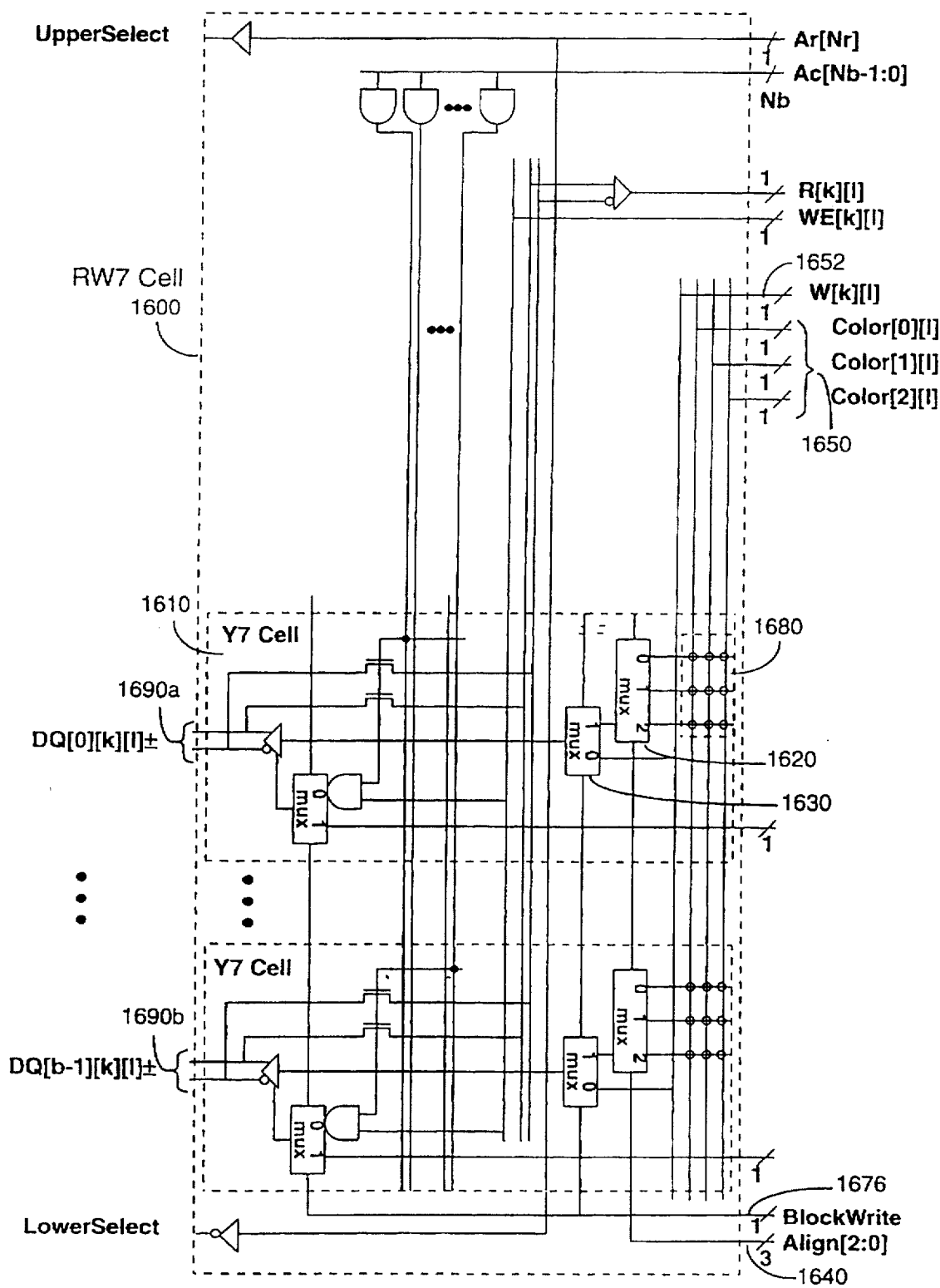
FIG. 16 illustrates the Read/Write control circuitry for three byte pixel depth in a block write DRAM.

FIG. 16 illustrates RW cell 1600 for accommodating a three byte-per-pixel depth. Each Y cell 1610 includes two-to-one multiplexer 1630 and three-to-one multiplexer 1620. The three-to-one multiplexers are controlled by Align[2:0] signals 1640. The three-to-one multiplexers steer the color register values (Color[2:0][1], i.e., 1650a thru 1650b) ultimately to the DQ[j][k][l] lines (1690a thru 1690b). The output of three-to-one multiplexer 1620 feeds into one of the inputs of two-to-one multiplexer 1630. This path is selected when BlockWrite 1676 is asserted. When BlockWrite 1676 is not asserted, W[k][l] write data bit 1652 is selected. The remainder of the RW cell is similar to what has been previously described (e.g., the RW3 cell of FIG. 5).

Table 5 summarizes the connection patterns (e.g., 1680) for the three-to-one multiplexer of the Y cells. This table illustrates the specific case when s, t, and b are 8, 8, and 8, respectively.

TABLE 5

| j | k=H | k=G | k=F | k=E | k=D | k=C | k=B | k=A |
|---|-----|-----|-----|-----|-----|-----|-----|-----|
| S | 0/2/1 | 2/1/0 | 1/0/2 | 0/2/1 | 2/1/0 | 1/0/2 | 0/2/1 | 2/1/0 |
| T | 2/1/0 | 1/0/2 | 0/2/1 | 2/1/0 | 1/0/2 | 0/2/1 | 2/1/0 | 1/0/2 |
| U | 1/0/2 | 0/2/1 | 2/1/0 | 1/0/2 | 0/2/1 | 2/1/0 | 1/0/2 | 0/2/1 |
| V | 0/2/1 | 2/1/0 | 1/0/2 | 0/2/1 | 2/1/0 | 1/0/2 | 0/2/1 | 2/1/0 |
| W | 2/1/0 | 1/0/2 | 0/2/1 | 2/1/0 | 1/0/2 | 0/2/1 | 2/1/0 | 1/0/2 |
| X | 1/0/2 | 0/2/1 | 2/1/0 | 1/0/2 | 0/2/1 | 2/1/0 | 1/0/2 | 0/2/1 |
| Y | 0/2/1 | 2/1/0 | 1/0/2 | 0/2/1 | 2/1/0 | 1/0/2 | 0/2/1 | 2/1/0 |
| Z | 2/1/0 | 1/0/2 | 0/2/1 | 2/1/0 | 1/0/2 | 0/2/1 | 2/1/0 | 1/0/2 |

The "2", "1", and "0" symbols refer to the Color[2:0] register bytes, respectively. The order of these bytes in each table entry is significant, showing the connection order to the multiplexer inputs selected by the Align[2]/Align[1]/Align[0] control signals 1640, respectively. The pattern repeats every three horizontal cells, and continues in the next horizontal row. This is consistent with a little-endian byte ordering in memory; that is, bytes that are less significant have a lower memory address. These concepts may be applied to a system using big-endian byte ordering. A DRAM with one ordering scheme could be utilized by a controller with the opposite scheme at the cost of a modest amount of conversion logic.

The functionality presented is used in the following manner. The memory controller component computes the following value:

BlockAlign=block mod 3 where "block" is the address of the block that is to be written (Ar[Nr−1:0],Ac[Nc−1:Nb]), and "mod" refers to the modulus (remainder) operation. The possible values of Block-Align are 0, 1, or 2. This causes Align[0], Align[1], or Align[2], respectively, to be asserted to all the Y cells in the DRAM. This selects one of the three possible alignments of the three byte pixels within the 64 byte block. This process is repeated for each block that is to be written. A possible method for the controller to transfer the BlockAlign value to the DRAM is to use the Ac[Nb−1:0] signals, which are otherwise unused during a block write. Alternatively, the DRAM can compute the BlockAlign value from the "block" address value {Ar[Nr−1:0],Ac[Nc−1:Nb ]} using the above equation.

The embodiment illustrated assumes that each mask bit for a three byte pixel in memory is set the same. In other words, the mask bits for any three byte pixel will either be 000 or 111. Using three bits to represent the same function for each byte is redundant. If three bytes are allocated to each pixel, there are 64/3 or 21⅓ pixels per block. Each block therefore contains 22 pixels or pixel fragments. Because each 64 bit mask value controls 22 pixels or pixel fragments, it is possible to allocate 2 mask bits per three byte pixel instead of 1 bit per byte. This would permit a multiple-color, maskable block write function, as previously described. Thus 44 mask bits (22 pixels×2 mask bits/pixel) could be used to control the entire block. Greater functionality is achieved with less than the full mask word. The assignment of the 44 bits of control information within the 64 bit mask value might be done in such a way as to minimize the line area required during fabrication of the DRAM and to minimize the complexity in the memory controller required to create the mask value. The memory controller would need to duplicate the control information at the beginning or end of the block to handle fragmented pixels (pixels which straddle a block boundary).

Alternatively, the extra control information available to block write could be used to make it approximately b times faster than a conventional write.

This approach might also be used for non-power-of-two pixel depths other than three. The block write hardware described here could be merged with any of the hardware previously described so that the DRAM could manage a variety of pixel depths.

Sense Cell with Separate Select and Data

The block write hardware described to this point has combined the selection (mask) information and data information together on the DQ signals. As an alternative, the selection and data information could remain separated all the way into the sense cell as illustrated in FIG. 17.

Figure 17:
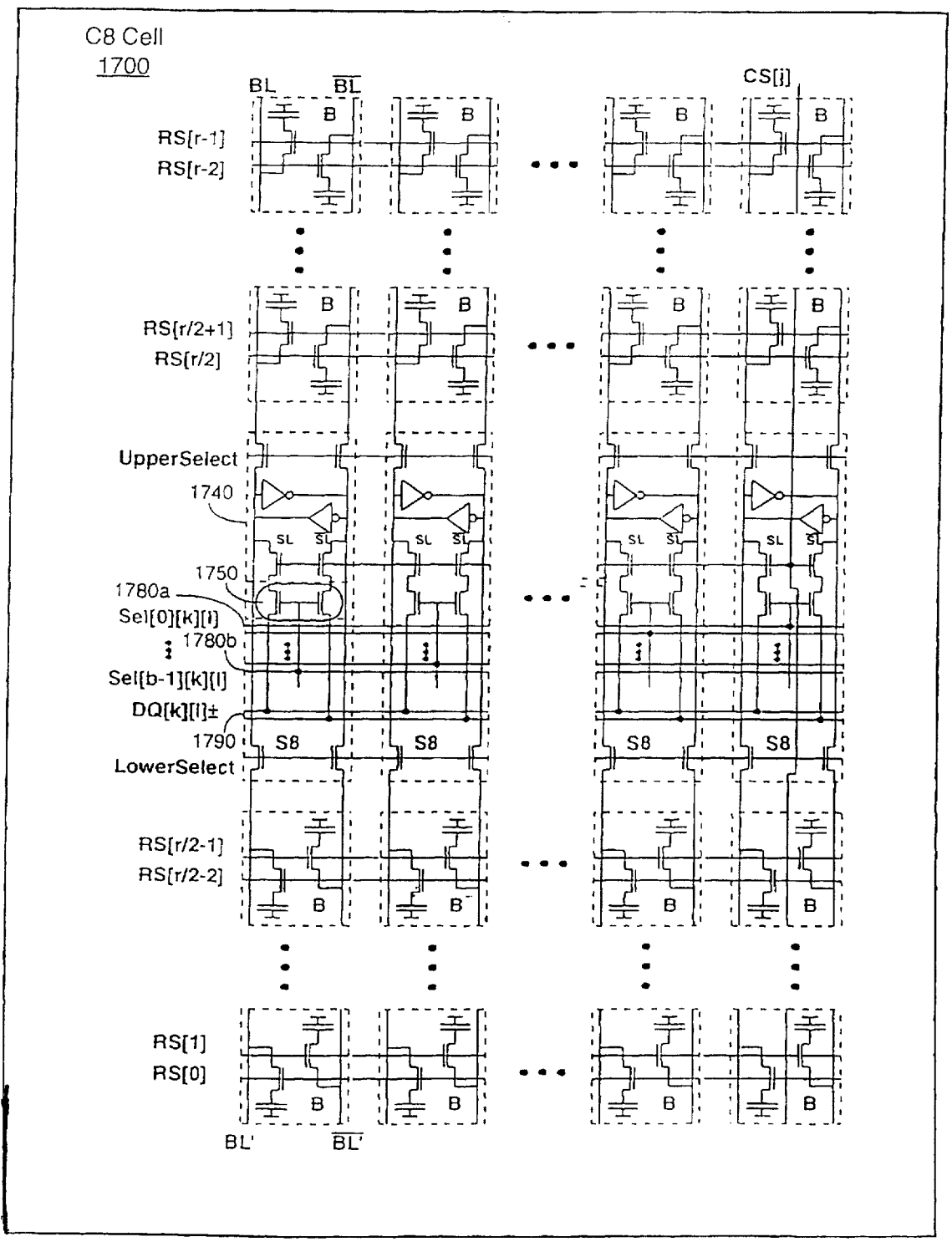
FIG. 17 illustrates a block write DRAM memory array having separate select and data lines.

FIG. 17 illustrates the modified C cell, C8, (1700). The b pairs of DQ signals have been replaced by b select signals 1780a thru 1780b (Sel[b−1:0][k][l]) and a single DQ signal pair 1790 (DQ[k][l]). This will reduce the wire area cost of a DRAM with block write, relative to a DRAM without the block write functionality. The select signals connect to a set of transistors (1750) or other gating means in each S8 cell 1740. This allows the b sense cells that are written in parallel to share the same data signal.

Figure 18:
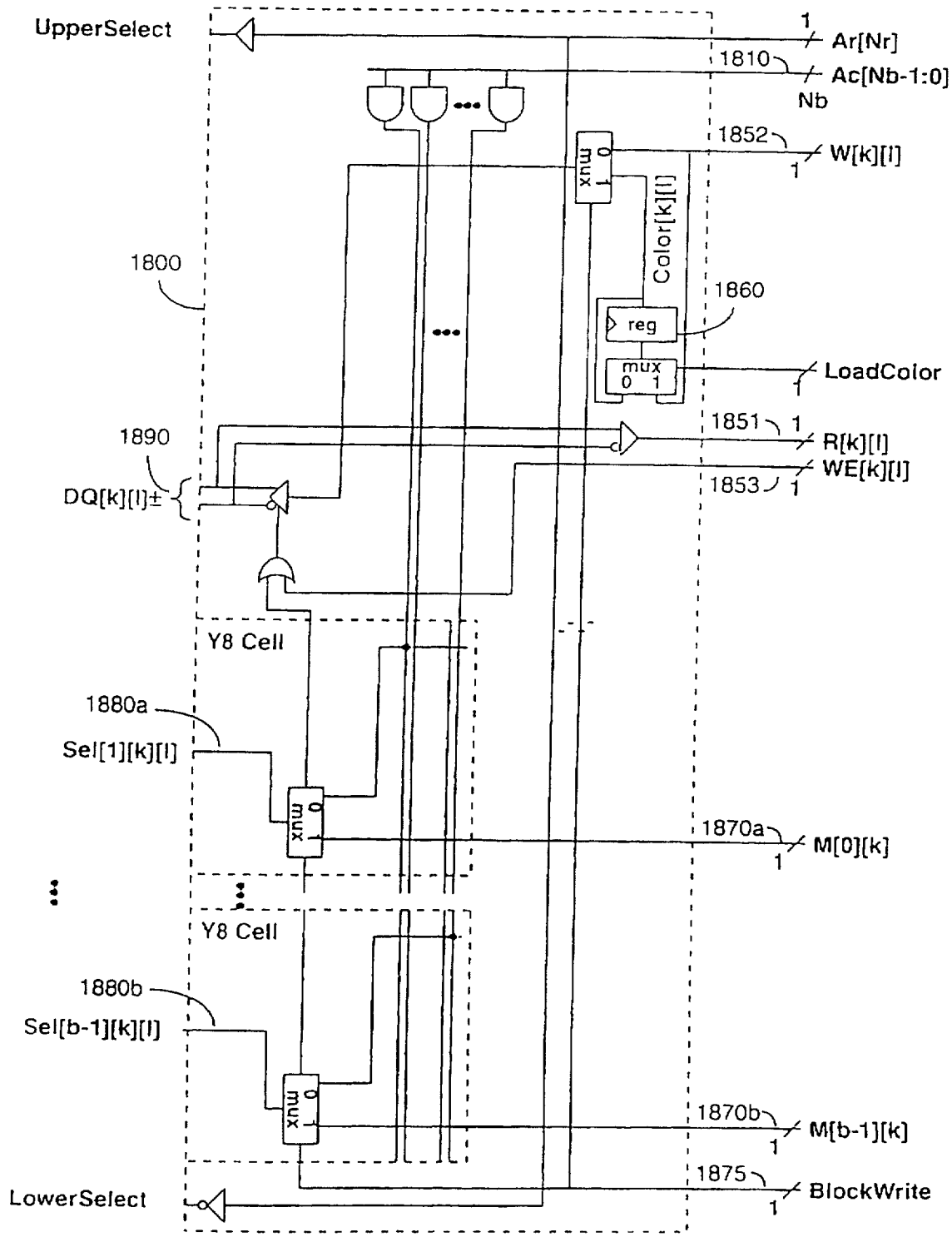
FIG. 18 illustrates a block write DRAM Read/Write control circuitry for separate select and data lines.

FIG. 18 illustrates how RW8 cell 1800 connects to the modified C8 cell 1700. The mask information M[b−1:0][k] (1870a thru 1870b) is gated directly onto the Sel[b−1:0][k][l] signals (1880a thru 1880b) if BlockWrite signal 1875 is asserted. If the BlockWrite signal is not asserted (i.e., a normal read or write operation), then decoded Ac[Nb−1:0] signal 1810 is steered to the select signals.

The data signal DQ[k][l] 1890 is steered to R[k][l] signal 1851 in the case of a normal read operation. In the case of a normal write operation, the W[k][l] signal 1852 is driven onto DQ[k][l] signal 1890 as enabled by the WE[k][l] enable signal 1853. In the case of a block write, the color register Color[k][l] 1860 is driven onto the DQ[k][l] signal 1890 as enabled by BlockWrite signal 1875.

Note that this hardware approach may not utilize two or more color registers, since the DQ signal can only be driven with a single value.

If the storage arrays of two or more bits could be interleaved, the hardware approach could further reduce the area overhead of block write. This permits the select lines to be shared, with separate DQ data lines.

Block Write with Reversed Bit/Byte Slicing

Figure 19:
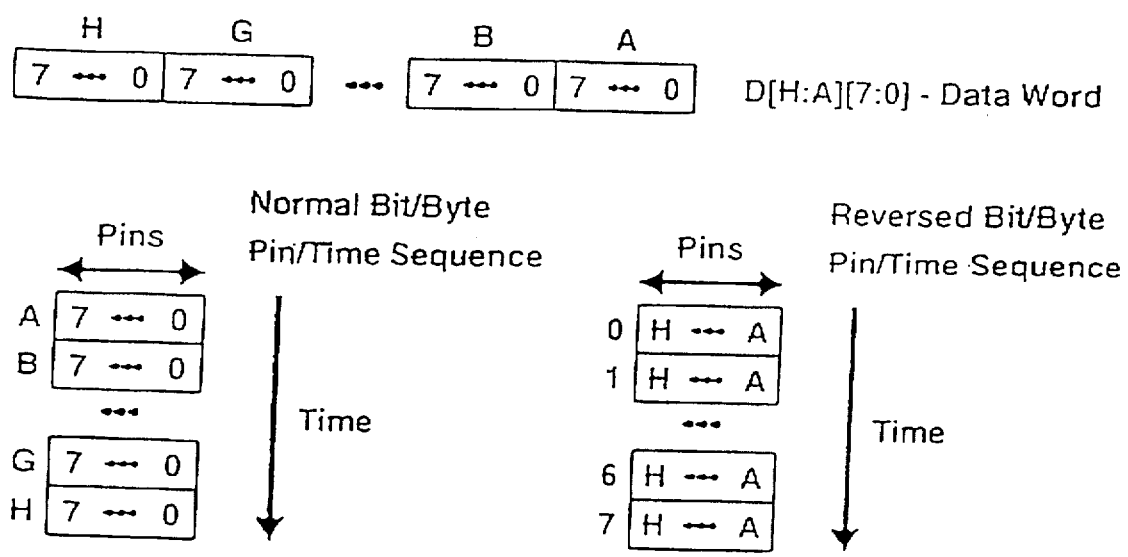
FIG. 19 illustrates normal and reversed bit/byte sequence for a Data Word.

Typically, memory component interfaces are arranged so that adjacent pins contain adjacent bits of a word. This normal bit/byte pin/time sequence (i.e., "normal sequence") is illustrated in FIG. 19. This illustration assumes eight bits per byte, eight bytes per word, and eight pins per memory component. In the normal bit/byte pin/time sequence each bit of a byte is associated with a pin and a byte is therefore carried on a group of pins at a first point in time. At a second, subsequent point in time, the same group of pins are associated with corresponding bits of a subsequent byte.

An alternative embodiment reverses the bit and byte assignments on pins. This reversed bit/byte pin/time sequence (i.e., "reversed sequence") is also illustrated in FIG. 19. Each pin in the reversed bit/byte pin/time sequence is associated with a byte instead of a bit of memory. At a first point in time each pin corresponds to the kth bit of its associated byte. At a second, subsequent point in time, each pin is associated with another bit of its associated byte.

There might be cost advantages when block write is implemented using the reversed bit/byte sequence approach. These advantages will also hold for values of s and t other than eight and eight, respectively, and memory components that have pin counts other than eight.

Figure 20:
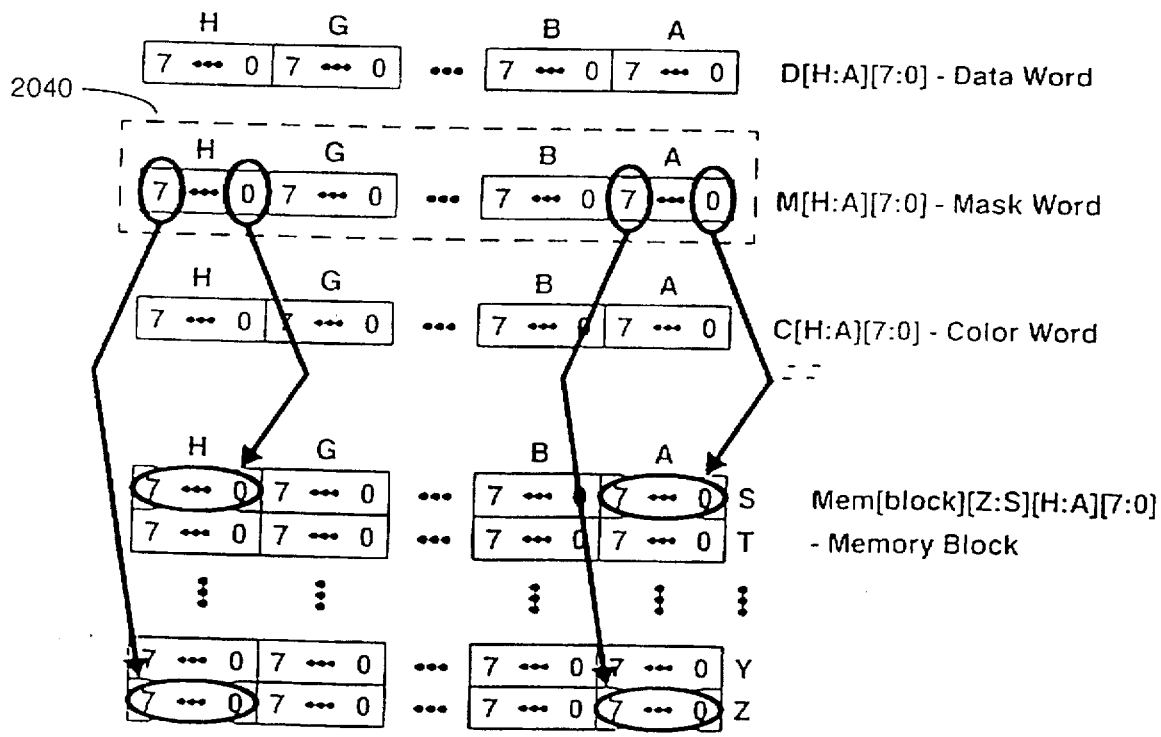
FIG. 20 illustrates the block and word mapping for the reversed bit/byte DRAM.
Figure 21:
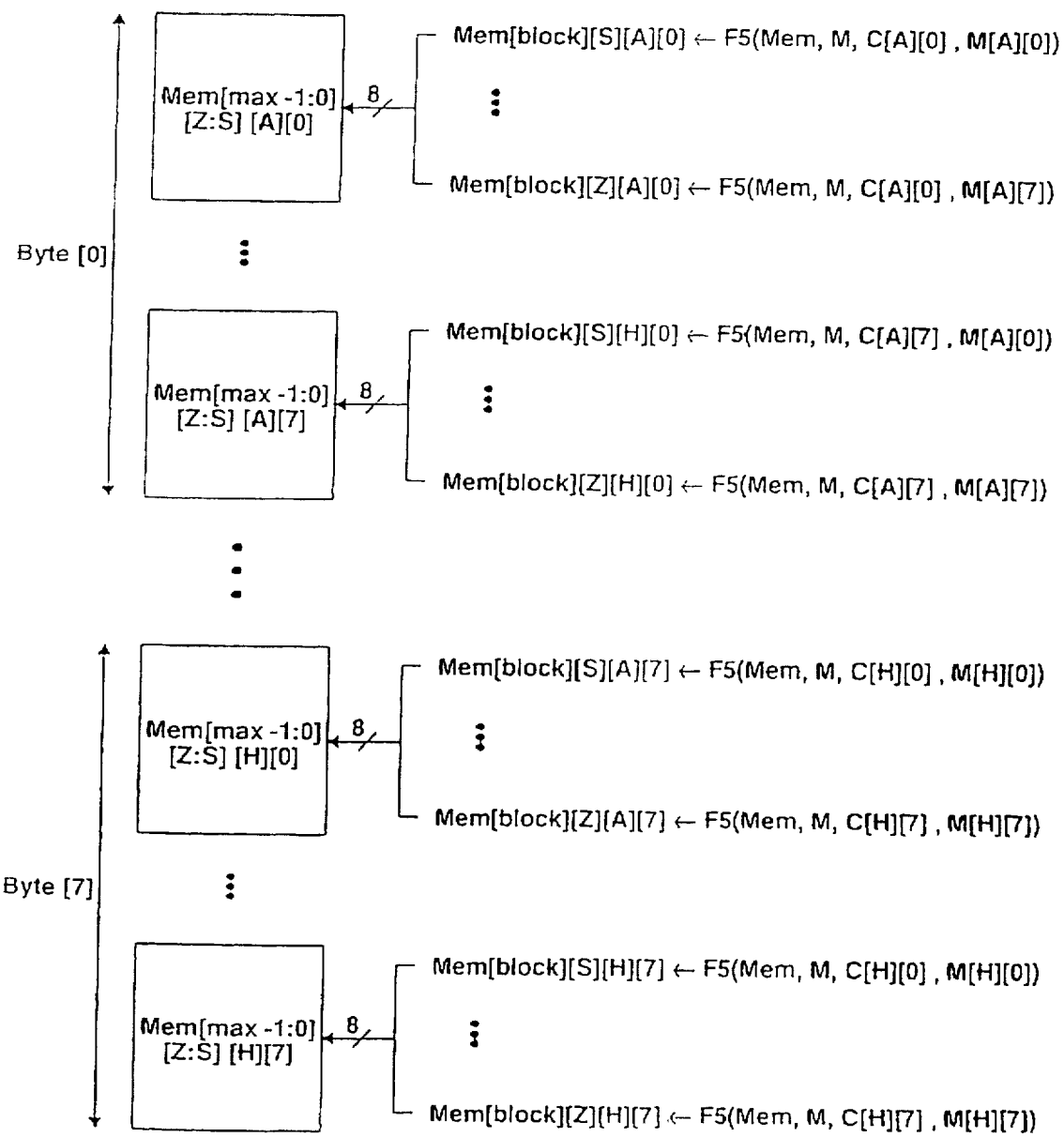
FIG. 21 illustrates the byte and bit mapping for the reversed bit/byte DRAM.

FIG. 20 shows the mapping notation for the block write having a reversed bit/byte pin sequence. The mask word has its bit/byte ordering reversed; the first eight bits of mask word M[A][7:0] affects the writing of memory bytes Mem [block][Z:S][A][7:0]. The bit and byte ordering for the data words, the color words, and the memory blocks are unchanged. This may be seen in FIG. 21.

The mapping of mask values to memory bytes is a function, F5, of the C and M registers such that:

$$Mem_{[block][j][k][7:0]}^{New}=F5(Mem_{[block][j][k][7:0]}^{Old}, M_{[0][0][j][k]}, C_{[0][0][k][7:0]})$$

The two indices shown have the following ranges:

j={7,6,5,4,3,2,1,0}
k={7,6,5,4,3,2,1,0} and F5(A, B, C)=A·B+C·B̄ such that:

$$Mem_{[block][j][k][7:0]}^{New}=Mem_{[block][j][k][7:0]}^{Old} \cdot M_{[0][0][j][k]} + C_{[0][0][k][7:0]} \cdot \overline{M}_{[0][0][j][k]}$$

Figure 22:
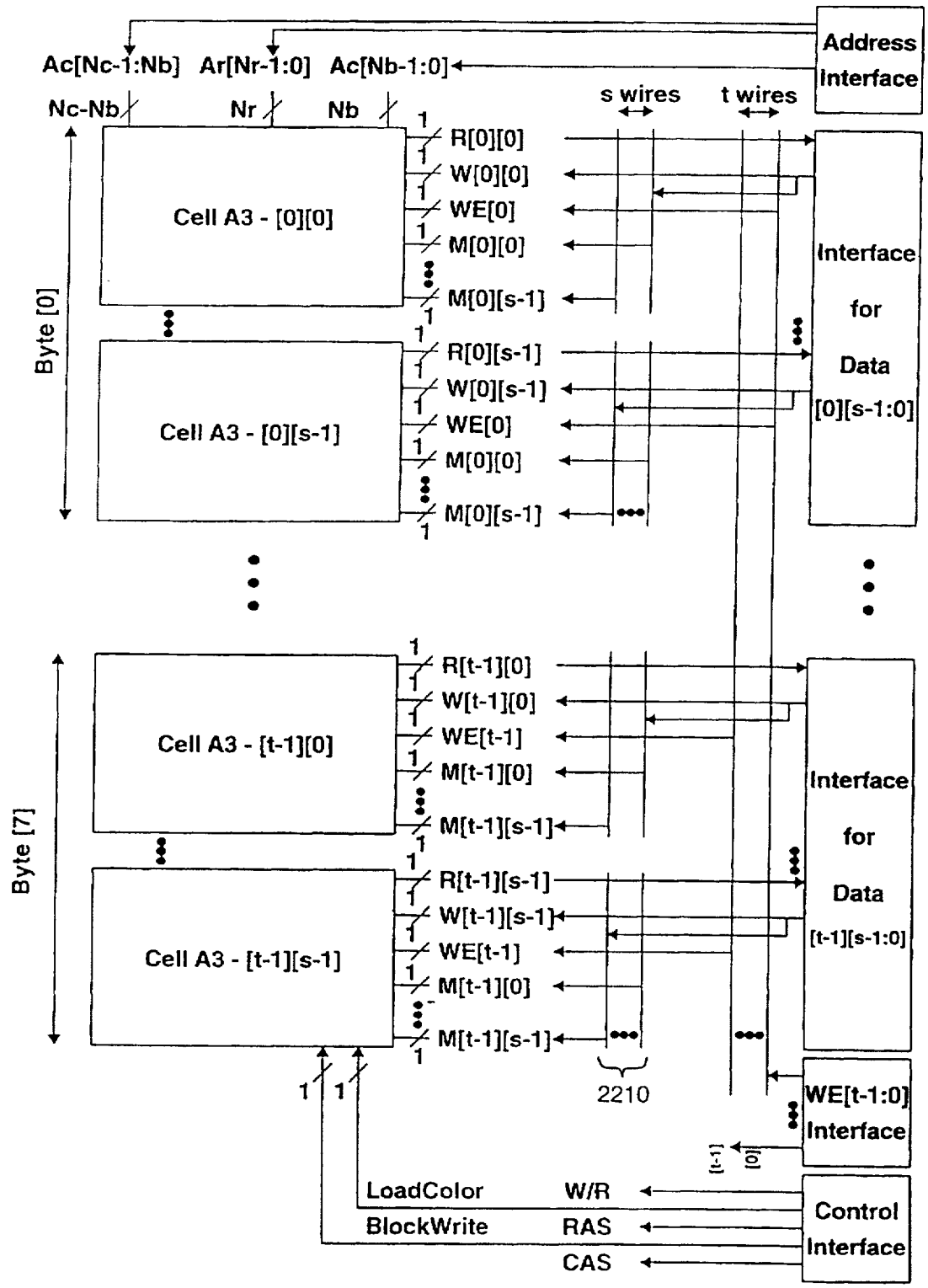
FIG. 22 illustrates a DRAM having reversed bit/byte data words.

One advantage of this bit/byte reversal is to save wire area during fabrication when the block write function is implemented. This may be seen in the diagram of a memory component as illustrated in FIG. 22. Note that the A3 cell is similar to that from FIG. 6. One difference with respect to other embodiments (e.g., FIG. 7) is the reduced number of wires required to bus the mask word across the memory component. In FIG. 7, write bus 710 requires s×t wires which must be bussed along the full height of the memory. Instead of one bus of s×t wires which extend the full height as shown in FIG. 7, there are t buses, each consisting of s wires and each extending across 1/t of the height. Thus the number of wires remains the same, however, the physical layout has changed so that the total length of the wires has been substantially reduced because each wire only extends across 1/t of the full height.

There might be a second advantage in reversing the bit/byte ordering if it is combined with the idea of separating the data and select information for the sense cell which has been previously discussed. When the data and select lines are separated, the select lines may be used for other bits if they share the select information. This would be the case if the bit/byte sense was reversed - two or more C8/R8 bit arrays might be interspersed with one set of select signals, and two or more sets of DQ signals. This could significantly reduce the height increase that is caused by adding block write to a memory component.

Block Write with Multiple Byte Granularity

Another embodiment of block write circuitry might avoid the need for additional DQ lines at the expense of a coarser resolution than the block write schemes (with byte granularity) which have already been discussed. This alternate embodiment is also capable of higher write bandwidths than the previous embodiments.

Figure 23:
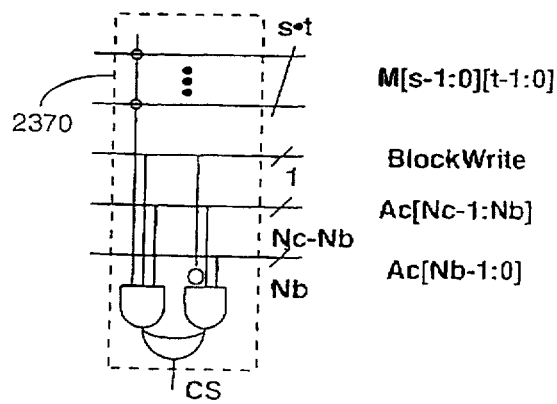
FIG. 23 illustrates column decode circuitry for a block write DRAM having multiple byte granularity.

FIG. 23 shows the column decode cell CDec10 2370 used in this embodiment. When BlockWrite is not asserted, the cell decodes the Ac[Nc−1:0] column address field and asserts one of the c column select lines, as before. If BlockWrite is asserted, then only the upper Nc-Nb bits of the column address field are decoded. This causes up to $2^{Nc-Nb}$ (or c/b) column select lines to be asserted. However, the s×t bits of the mask select word M[s−1:0][t−1:0] are "anded" with the column decoders, so that any subset of the group of c/b column select signals is asserted. As before, s is the number of bits per byte, and t is the number of bytes per word. However, the number of words per block b is no longer an independent parameter, as before, but is instead equal to s×t.

Figure 24:
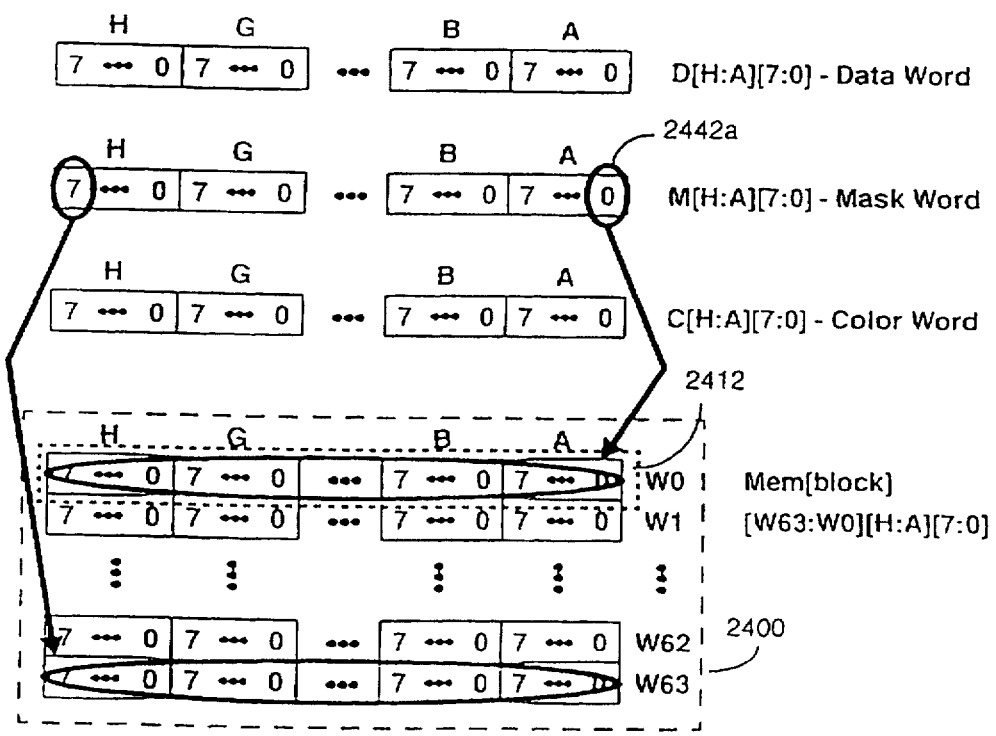
FIG. 24 shows the block and word notation for a Block Write DRAM having multiple byte granularity.

For the example of s and t equal to eight and eight, respectively, the block size will be 64 words. This means that in each write operation a block of 64 words, each word having 64 bits, is written. Within the block, any particular word may be written or not written, depending upon the 64 bit mask value. FIG. 24 illustrates this example. Because one mask bit (2442a) controls whether 64 bits of each word 2412 is written into block 2400, this block write alternative has approximately eight times the bandwidth of the previously discussed schemes. This comes at the cost of a granularity (resolution) that is eight times coarser. However, if both the coarse resolution and fine resolution block write functions were included in a DRAM, the first might be used for the large area fills and the second might be used for small areas and the edges of large regions.

Figure 25:
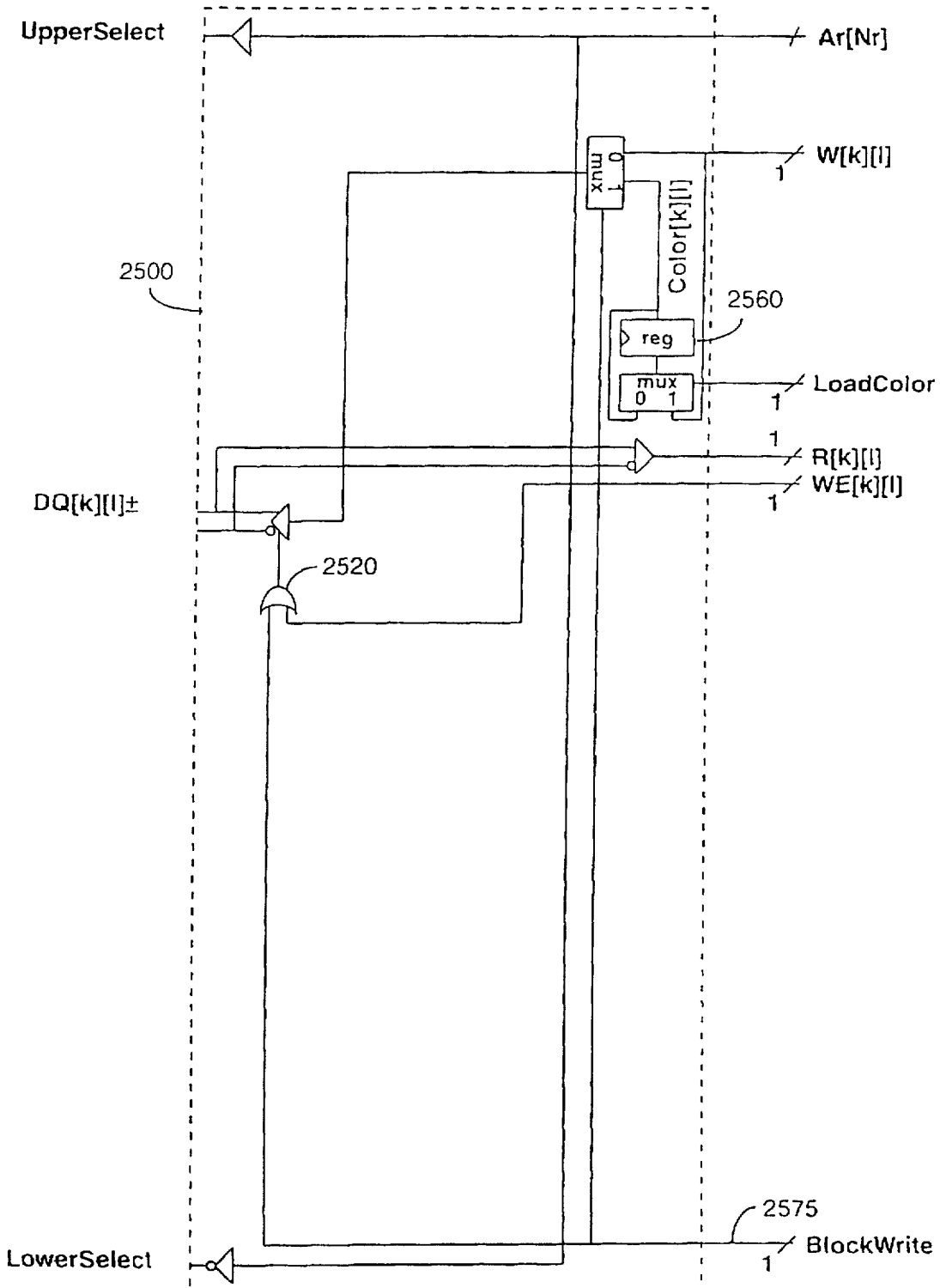
FIG. 25 illustrates Read/Write control circuitry for a Block Write DRAM having multiple byte granularity.

FIG. 25 shows the RW cell 2500 that is needed for multi-byte block write. In addition to the read and write drivers, there is a color register bit Color[k][l] 2560 and an "OR" gate 2520 for enabling the write driver when Block-Write 2575 is asserted.

Figure 26:
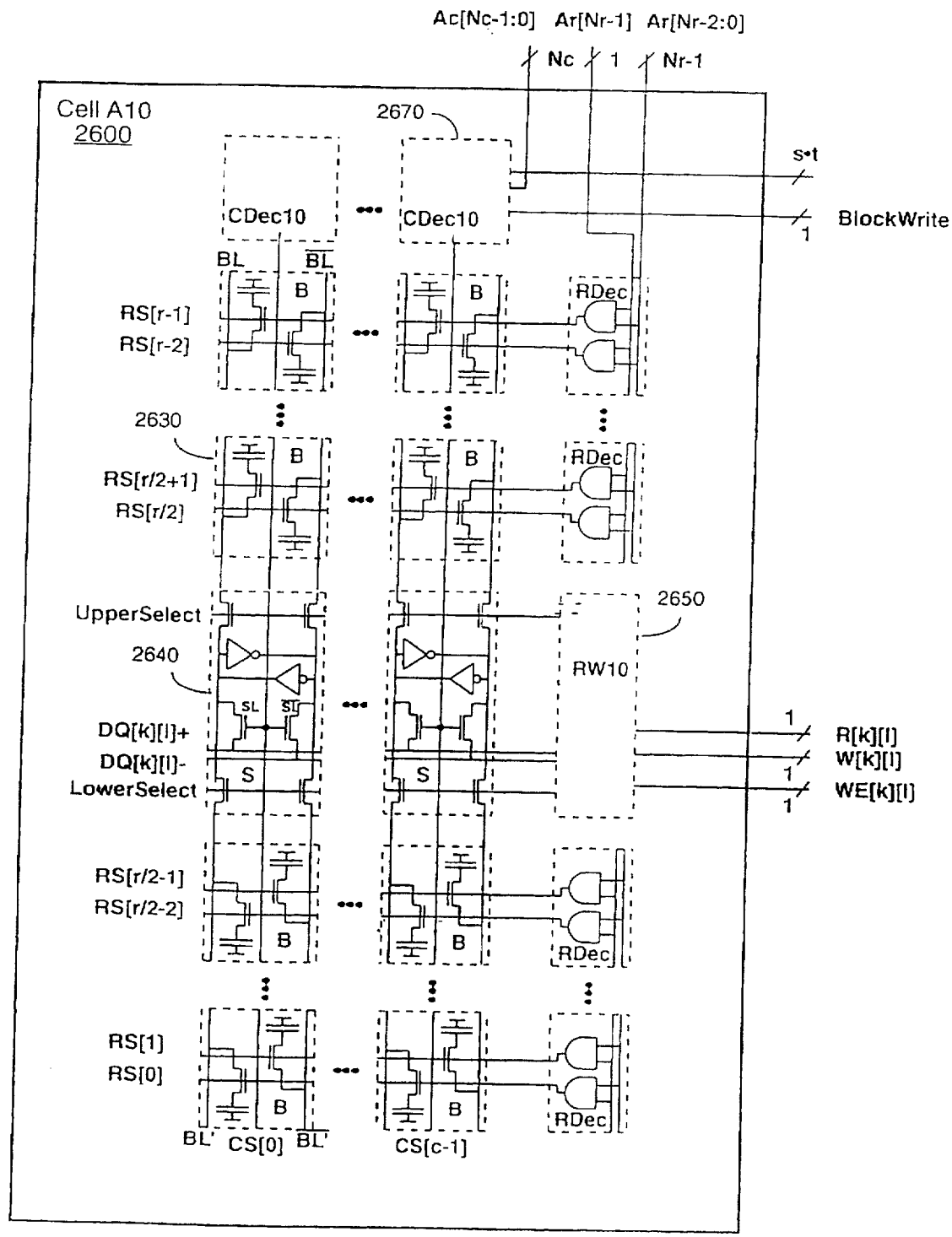
FIG. 26 illustrates a memory array for a Block Write DRAM having multiple byte granularity.

FIG. 26 illustrates the A cell that is needed for multi-byte block write. The A cell of FIG. 26 includes the B and S cells from the baseline DRAM, and the CDec10 and RW10 cells just described.

Figure 27:
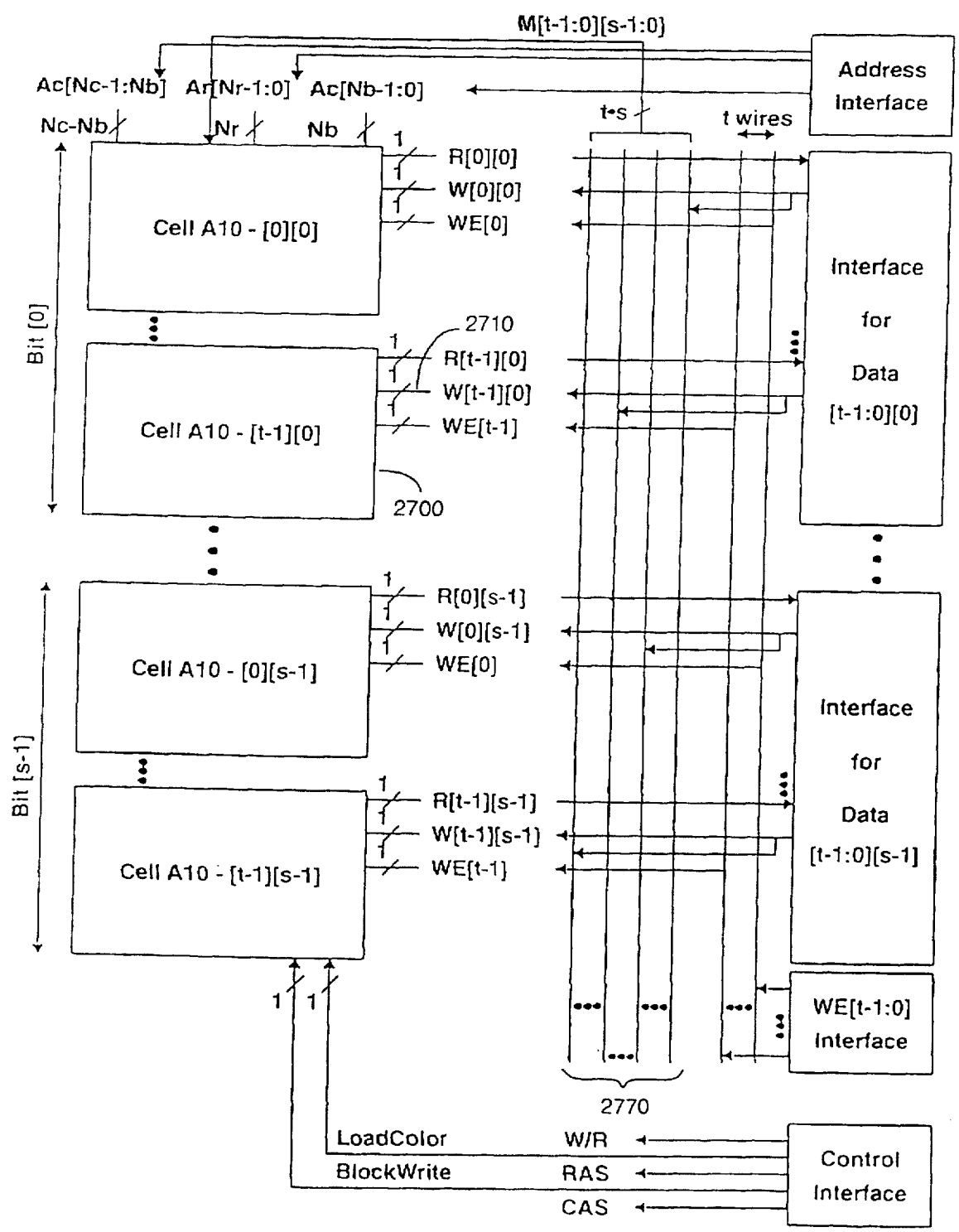
FIG. 27 illustrates a Block Write DRAM having multiple byte granularity including the memory array and the Read/Write control circuitry.

FIG. 27 shows how the A10 cells are used in a DRAM with multi-byte block write. Note that the s×t mask word is driven from the W[t–1:0][s–1:0] lines into the column decode cells. This adds s×t lines vertically and s x E lines horizontally.

Block Write with Row Granularity

Figure 28:
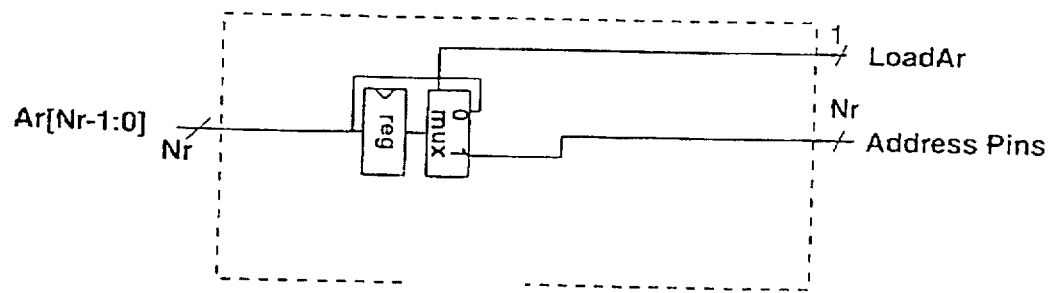
FIG. 28 illustrates typical logic for storing a row address within an address interface cell of a DRAM.

There is another block write function which has relatively coarse granularity and which can be implemented relatively inexpensively. Inside the address interface cell of a conventional DRAM (FIG. 3) there is logic to store the row address Ar[Nr–1:0]. FIG. 28 shows the details of this logic.

When the signal LoadAr is asserted, a field from the address pins is loaded into the Ar register. Alternatively, the field may come from the data pins. This Ar register drives the Ar[Nr–1:0] lines. This value is held for as long as the row is being sensed in the sense amplifiers. This permits an implicit restore operation to replace the row contents in the storage cells which were lost by the destructive sense operation. The row address must also be held so that write-through operations will keep the row contents of the storage cells the same as the contents of the sense amplifiers after every write operation.

The LoadAr signal is derived from the RAS signal, which indicates that the row address fields of the address pins are valid. In one embodiment, the RAS signal is received from a dedicated pin. In another embodiment, the RAS signal is derived from a combination of input pins and the internal state of the DRAM.

Figure 29:
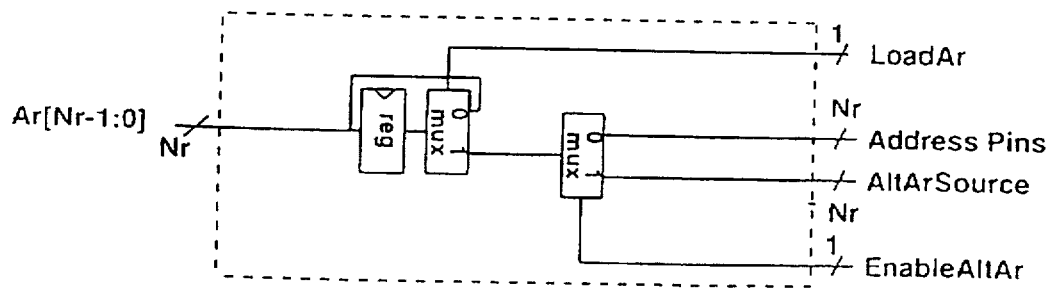
FIG. 29 illustrates modifications to address interface circuitry to permit a block write having row granularity.

Some DRAMs may permit control registers to be read and written. These registers allow the DRAM to be configured for different modes of operation. This mechanism may be used to deliberately change the value in the Ar register while a row is sensed in the sense amplifiers. One embodiment of logic circuitry for accomplishing this is shown in FIG. 29.

When EnableAltAr is deasserted, the Ar register is loaded from an address pin field as before. When EnableAltAr is asserted, the Ar register may be loaded from an alternate address source AltArSource[Nr–1:0]. One obvious alternate source is a data pin field, although others are possible.

The ability to change the Ar register contents provides another block write capability. If one row is sensed in the normal fashion (e.g., row X), then the Ar register will contain X and the sense amplifiers will contain Mem(X). Next, the EnableAltAr signal and LoadAr signals are asserted, permitting a new value (e.g., Y) to be loaded into the Ar register.

This new value allows the sense amplifier contents Mem (X) to automatically write-through to row Y. Alternatively, other control signals may have to be asserted in order to explicitly restore the sense amplifiers to the B storage cells in row Y. In either case, the block at Mem(X) has been written to Mem(Y) in the time required to perform an implicit restore or explicit restore. This tends to be considerably faster than the other block write functions already discussed. The disadvantage is that it has very coarse resolution. The block size, b, is given as:

$$b = c \times s \times t$$

where s is the number of bits per byte, t is the number of bytes per word, and c is the number of words per row. Subfields of the block can not be masked out when the block is written from the sense amplifiers to the storage cells.

The block is the size of a row, which is c words (each word having t bytes). This permits a block write bandwidth that is approximately c×tCAS/tWT times the bandwidth of conventional write, at the cost of reduced write resolution. Here tCAS is the CAS—access cycle time, and tWT is the write-through cycle time.

This functionality might be combined with one or more of the previously discussed block write functions in order to provide a range of performance and granularity tradeoffs.

Write-Per-Bit Masking

The writing of individual bits within a word may be controlled during a block write. This functionality might be important, for example, because a word might contain pixel information and non-pixel information, with the division occurring on non-byte boundaries. For example, if a memory is designed with nine bits per byte, eight bits of each byte might contain color information and the ninth bit might contain information used for other purposes. The finest resolution of the block write functions previously described have a minimum granularity of one byte.

Figure 30:
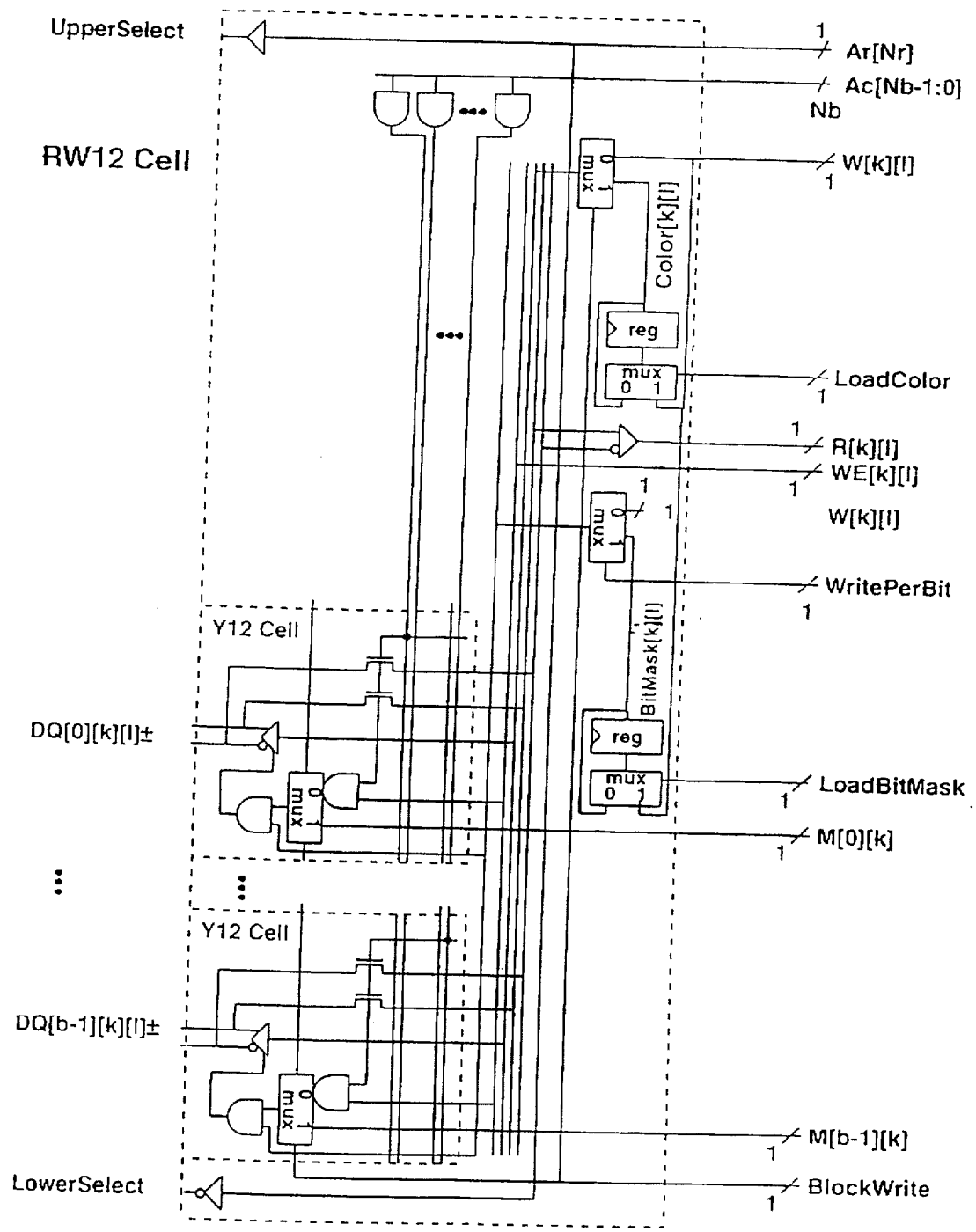
FIG. 30 illustrates modifications to the Read/Write cell for supporting write per bit masking.

The RW cell can be modified to support a finer granularity as illustrated in FIG. 30. A single bit of a bit mask value BitMask[k][l] has been added to control the write enable on a bit-by-bit basis. It is loaded from the W[k][l] signal when LoadBitMask is asserted. The value BitMask[k][l] is bussed to all b of the Y12 cells in the RW12 cell. An "AND" gate combines this signal with the output of the two-to-one multiplexer in each Y12 cell. The output of the "AND" gate is connected to the enable of the write driver. If the Write-PerBit signal is deasserted, then every write driver is enabled by the local two-to-one multiplexer in the Y12 cell. If WritePerBit is asserted, then some additional write drivers may be disabled.

Note that each word written during a block write has the same pattern of bits enabled or disabled by the BitMask value. The write-per-bit function may be used with any of the block write functions previously described. The write-per-bit function may also be used with the conventional write function.

In the foregoing specification, the invention has been described with reference to specific exemplary embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. Memory apparatus for performing a maskable, multiple color block write, comprising:
   a mask register;
   a block of memory having pixel addresses, wherein each pixel address corresponds to at least two mask value bits stored in the mask register;
   a plurality of color registers;
   control circuitry for selecting pixel addresses in accordance with their corresponding mask value bits in response to a block write signal, wherein a color value for each selected pixel address is selected from one of the plurality of color registers in accordance with the corresponding mask value bits, wherein the selected color values are written to the selected pixel addresses substantially simultaneously.

2. The apparatus of claim 1 wherein each pixel address is associated with a pixel comprising n bytes, wherein n is a power of 2.

3. The apparatus of claim 1 wherein each pixel address is associated with a pixel comprising n bytes, wherein n is not a power of 2.

4. The apparatus of claim 3 wherein n is 3.

5. The apparatus of claim 1 wherein the block of memory further comprises sense cells having separate data and select signal lines.

6. The apparatus of claim 1 wherein the memory block further comprises interfacing circuitry having a plurality of data pins for accessing the block of memory, wherein each data pin is associated with a distinct byte of the block of memory, wherein the interfacing circuitry is coupled to the control circuitry.

7. A method of performing a maskable, multiple color block write, comprising the steps of:
   a) storing a mask value within a mask register, wherein each pixel address within a block of memory corresponds to at least two mask value bits;
   b) selecting pixel addresses from the block of memory in accordance with the corresponding mask value bits;
   c) performing the following steps for each selected pixel address substantially simultaneously:
      i) selecting a color value in accordance with the corresponding mask value bits for that selected pixel address;
      ii) writing the color value to the selected pixel address.

8. The method of claim 7 wherein step (c)(i) further comprises the step of selecting the color value from one of a plurality of color registers.

9. The method of claim 7 wherein each pixel address corresponds to an n byte pixel, wherein n is a power of 2.

10. The method of claim 7 wherein each pixel address corresponds to an n byte pixel, wherein n is not a power of 2.

11. The method of claim 10 wherein n is 3.

12. The method of claim 7 wherein the block of memory comprises sense cells having separate data and select signal lines.

13. The method of claim 7 wherein the memory block further comprises interfacing circuitry having a plurality of data pins for accessing the block of memory, wherein each data pin is associated with a distinct byte of the block of memory.

* * * * *